United States Patent
Asai et al.

(10) Patent No.: US 6,276,051 B1
(45) Date of Patent: *Aug. 21, 2001

(54) ELECTRIC-COMPONENT TRANSFERRING APPARATUS

(75) Inventors: Koichi Asai, Nagoya; Kazufumi Suga, Toyota, both of (JP)

(73) Assignee: Fuji Machine Mfg. Co., Ltd., Chiryu (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/233,021

(22) Filed: Jan. 20, 1999

(30) Foreign Application Priority Data

Jan. 29, 1998 (JP) .................................................. 10-017344
Mar. 30, 1998 (JP) .................................................. 10-083966

(51) Int. Cl.⁷ ........................................................ H05K 3/30
(52) U.S. Cl. ................................. 29/740; 29/741; 29/743; 29/DIG. 44; 29/742; 29/832; 29/833; 29/834
(58) Field of Search ............................. 29/740, 741, 743, 29/DIG. 44, 832, 833, 834, 742

(56) References Cited

U.S. PATENT DOCUMENTS 5,421,696 * 6/1995 Stephan et al. ...................... 29/740 X
5,960,534 * 10/1999 Yazawa et al. ...................... 29/740 X

* cited by examiner

*Primary Examiner*—Lee Young
*Assistant Examiner*—Rick Kiltae Chang
(74) *Attorney, Agent, or Firm*—Oliff & Berridge, PLC

(57) ABSTRACT

An electric-component transferring apparatus including a component holder which holds an electric component, a shaft member whose lower end portion supports the component holder, a movable member having a support hole which supports the shaft member such that the shaft member is rotatable about an axis line relative to the movable member and is movable relative to the movable member in an axial direction parallel to the axis line, a moving device which moves the movable member in a direction intersecting the axis line of the shaft member, a piston which is supported by the shaft member such that the piston is not movable relative to the shaft member in the axial direction of the shaft member, the support hole including a portion defining a cylinder bore which cooperates with the piston to provide an air-pressure-operated cylinder device, a driven wheel which is substantially integral with the shaft member, and a drive wheel which is supported by the movable member such that the drive wheel is meshed with the driven wheel to rotate the driven wheel, one of the drive wheel and the driven wheel having a length which assures that the drive and driven wheels are kept meshed with each other when the driven wheel is moved with the shaft member in the axial direction thereof.

23 Claims, 13 Drawing Sheets

ELECTRIC-COMPONENT TRANSFERRING APPARATUS

BACKGROUND OF THE INVENTION

1. Field of the Invention

The present invention relates to an electric-component transferring apparatus, a method of taking respective images of electric components (i.e., circuit components as elements of an electric or electronic circuit), and a system for mounting electric components on a circuit substrate such as a printed circuit board.

2. Related Art Statement

There is known an electric-component ("EC") transferring device which includes an EC holder for holding an EC, a shaft member for supporting the EC holder, and a moving device for moving the EC holder in a direction intersecting an axis line of the shaft member, and thereby transferring the EC in that direction. This sort of EC transferring device is disclosed in, e.g., Japanese Patent Application laid open for public inspection under No. 8(1996)-78882. The disclosed device includes an EC holder which holds an EC; a shaft member whose lower end portion supports the EC holder; a movable member having a support hole which supports the shaft member such that the shaft member is rotatable about an axis line relative to the movable member and is movable relative to the movable member in an axial direction parallel to the axis line; and a moving device which moves the movable member in a direction intersecting the axis line of the shaft member.

The above-indicated EC transferring device is employed as an EC mounting device which takes an EC from an EC supplying device and mounts the EC on a printed circuit board ("PCB") as a sort of circuit substrate that is an object on which ECs are to be mounted. The EC mounting device includes an EC mounting head; an X-Y robot which moves the EC mounting head in each of two directions perpendicular to each other on a horizontal plane; a Z-axis/θ-axis motor which is provided on the X-Y robot, which moves the head in a vertical direction (i.e., a Z-axis direction) perpendicular to the horizontal plane, and which rotates the head about a vertical axis line; and an EC-image taking device which is provided between the EC supplying device and the PCB.

The Z-axis/θ-axis motor includes a Z-axis motor portion and a θ-axis motor portion which are integrated with each other and each of which includes an AC servomotor (i.e., brushless DC servomotor). The Z-axis motor portion further includes a nut which is supported by an upper portion of a housing such that the nut is rotatable about a vertical axis line and is not movable in an axial direction parallel to the axis line; and a ball screw which is fitted in the housing such that the ball screw is movable in an axial direction thereof, and is not rotatable, relative to the housing and which is screwed with the nut. A permanent magnet which is fixed to an outer circumferential surface of the nut provides a rotor of the AC servomotor of the Z-axis motor portion. The rotor is opposed to a stator core which is provided in the housing. The stator core includes a plurality of coils. An electric current which is supplied to the coils is so controlled as to rotate the nut by an arbitrary angle in each of opposite directions and thereby move the ball screw over an arbitrary distance in each of upward and downward directions.

A lower portion of the housing supports a ball-spline member which is concentric with the ball screw and which is rotatable, and is not movable in an axial direction thereof, relative to the housing. A spline-axis member is fitted in the ball-spline member such that the spline-axis member is not rotatable, and is movable in an axial direction thereof, relative to the ball-spline member. A permanent magnet which is fixed to the ball-spline member provides a rotor of the AC servomotor of the θ-axis motor portion. The rotor is opposed to another stator core which is provided in the housing. The second stator core includes a plurality of second coils. An electric current which is supplied to the second coils is so controlled as to rotate the ball-spline member by an arbitrary angle in each of opposite directions and thereby move the spline-axis member over an arbitrary angle in a corresponding one of the opposite directions.

The spline-axis member is connected to the ball screw such that the spline-axis member is rotatable, and not movable in its axial direction, relative to the ball screw. The EC mounting head is attached to a lower end portion of the spline-axis member. The spline-axis member and the ball screw cooperate with each other to provide a shaft member whose lower end portion supports an EC holder, and respective inner holes of the nut and the ball-spline member cooperate with each other to define a support hole which supports the shaft member. When the ball screw is moved up and down, the spline-axis member is moved up and down and the EC mounting head is moved up and down. When the spline axis member is rotated, the head is rotated about its axis line. While the head is moved down and then up, the head takes an EC from the EC supplying device, or mounts the EC on the PCB. While the head is rotated, a possible angular error of the EC held by the head from a reference angular position about a vertical axis line may be corrected. Since the EC mounting head is moved up and down, and rotated, by the single Z-axis/θ-axis motor including the upper Z-axis motor portion and the lower θ-axis motor portion integrated with each other, the EC mounting device enjoys a simple construction as compared with one in which a Z-axis motor and a θ-axis motor are employed as separate members.

However, the two servomotors are used, one for moving the EC mounting head up and down, and the other for rotating the head. In addition, the ball screw and the spline-axis member are connected to each other such that they are rotatable, and not movable in their axial direction, relative to each other. Thus, the EC mounting device suffers from a high production cost. Moreover, since the nut, the ball-spline member, the rotors, and the stators are provided around the ball screw and the spline-axis member, the EC mounting device suffers from a large size.

Japanese Patent Application laid open for public inspection under Publication No. 7(1995)-45995 discloses an EC mounting system including an EC sucker which sucks and holds an EC by applying vacuum thereto, and an EC supplying device which supplies an EC to the EC sucker. Thus, the EC sucker takes the EC from the EC supplying device, and subsequently mounts the EC on a CS. However, the EC held by the EC sucker may have an positional error from a reference position on a plane intersecting an axis line of the EC sucker. This positional error is an error of the center of the EC relative to the axis line of the EC sucker, and results from the dislocation of the EC on the EC supplying device, from its reference position relative to the supplying device, and/or the misalignment of the EC relative to the EC sucker when the EC is sucked by the sucker. To solve this problem, it has been practiced to employ an EC-image taking device which takes an image of the EC taken by the EC sucker from the EC supplying device and calculate, based on the taken image, a positional error of the EC held by the sucker from its reference position relative to the sucker. This positional error is corrected before the EC is mounted on the CS, and accordingly the EC is accurately mounted at a prescribed EC-mount place on the CS.

In the above-indicated EC mounting system, the EC sucker is supported by a movable member which is movable in each of an X-axis and a Y-axis direction which are perpendicular to each other on a horizontal plane, and the EC-image taking device is provided between the EC supplying device and a CS supporting device which supports the CS. While the EC sucker is moved toward the CS supporting device after taking the EC from the EC supplying device, the EC-image taking device takes an image of the EC held by the EC sucker.

In the above EC mounting system, the movable member supports the single EC sucker. Therefore, each time one EC is mounted on the CS, the movable member goes and backs between the EC supplying device and the CS supporting device. If the movable member would support a plurality of EC suckers, a plurality of ECs could be mounted on the CS while the movable member goes and backs one time between the EC supplying device and the CS supporting device. This would lead to improving the efficiency of mounting of ECs.

However, the EC-image taking device can take, at one time, an image of only one EC. Therefore, each time an image of one EC is taken, the movable member must be moved to position the next EC at an image-take position. This operation needs a long time, which leads to lowering the efficiency of mounting of ECs.

SUMMARY OF THE INVENTION

It is therefore an object of the present invention to provide an electric-component transferring apparatus which moves a component holder holding an electric component, in an axial direction thereof, and rotates the holder about an axis line thereof and which enjoys a low cost and a compact construction.

It is another object of the present invention to provide an electric-component mounting system including the above electric-component transferring apparatus.

It is another object of the present invention to provide a method of taking respective images of electric components with high efficiency.

It is another object of the present invention to provide an electric-component mounting system for mounting electric components with high efficiency.

The present invention provides an electric-component transferring apparatus, an electric-component mounting system, and an electric-component-image taking method which have one or more of the technical features that are described below in respective paragraphs given parenthesized sequential numbers (1) to (31). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed. However, the following technical features and the appropriate combinations thereof are just examples to which the scope of the present invention is by no means limited.

(1) According to a first feature of the present invention, there is provided an electric-component transferring apparatus comprising at least one component holder which holds an electric component; at least one shaft member whose lower end portion supports the component holder; a movable member having at least one support hole which supports the shaft member such that the shaft member is rotatable about an axis line relative to the movable member and is movable relative to the movable member in an axial direction parallel to the axis line; a moving device which moves the movable member in a direction intersecting the axis line of the shaft member; a piston which is supported by the shaft member such that the piston is not movable relative to the shaft member in the axial direction of the shaft member; the support hole including a portion defining a cylinder bore which cooperates with the piston to provide an air-pressure-operated cylinder device; a driven wheel which is substantially integral with the shaft member; a drive wheel which is supported by the movable member such that the drive wheel is meshed with the driven wheel to rotate the driven wheel; and one of the drive wheel and the driven wheel having a length which assures that the drive and driven wheels are kept meshed with each other when the driven wheel is moved with the shaft member in the axial direction thereof. It is preferred that the movable member be one which is moved by the moving device in a direction perpendicular to the axis line of the shaft member, for example, one which is moved in each of two directions which are parallel to an X axis and a Y axis, respectively, which are perpendicular to each other on a horizontal plane, or one which is rotated about a vertical axis line. On the movable member, the shaft member may be moved in its axial direction not only by the air-pressure-operated cylinder device (hereinafter, referred to as the "air cylinder") but also by another device independent of the air cylinder. The component holder may be one, in accordance with a second feature (2) described below, which includes a suction nozzle which sucks and holds an electric component ("EC") by applying vacuum thereto; one which includes a grasping device which includes a plurality of grasping members and grasps and releases an EC by closing and opening the grasping members; or any one of various known holders. The component holder may be one which is produced integrally with the shaft member; or one which is produced as a member which is separate from the shaft member and which is detachably attached to the shaft member. The axial line of the shaft member may not be vertical, that is, the shaft member may extend in a direction inclined with respect to a vertical direction. The air cylinder may be of a single-action or double-action type. The present EC transferring apparatus transfers an EC by moving the movable member and accordingly the shaft member, thereby moving the component holder to a position above the EC, and operating the air cylinder to lower the shaft member so that the component holder holds the EC. Subsequently, the air cylinder is operated to elevate the shaft member so that the component holder picks up the EC, and the movable member is moved to move the shaft member and thereby transfer the EC so that the EC is received by an EC receiving member such as a PCB. In the case where an angular error of the EC held by the component holder from a reference angular or rotation position is corrected and/or a current angular position of the EC at which the EC is picked up by the holder is changed to a prescribed angular position at which the EC is received by the EC receiving member, the driven wheel is rotated by the drive wheel, so that the shaft member and the component holder are rotated about their axis line and accordingly the EC is rotated. Since one of the drive wheel and the driven wheel has a length which assures that the drive and driven wheels are kept meshed with each other when the driven wheel is moved with the shaft member in the axial direction thereof, the shaft member can be moved in its axial direction while being kept in the state in which the shaft member can receive the rotation of the drive wheel. Since the air cylinder, the driven wheel, and the drive wheel are cheap, the EC transferring apparatus which rotates the shaft member and moves the same in its axial direction enjoys a low production cost. A dimension of the EC transferring apparatus in a direction parallel to the axis line of the shaft member is greater than that of an EC transferring device in which no air cylinder is employed, but is smaller than that of a conventional EC transferring device in which a Z-axis motor and a θ-axis motor are provided in series in a direction parallel to an axis line of a shaft member. Thus, the present EC transferring apparatus enjoys a compact construction. Since the drive wheel is provided in series with the shaft member, the dimension of the EC transferring apparatus in the direction parallel to the axis line of the shaft member is increased as such. However, since the drive and driven wheels are just required to transmit rotation to the shaft member, the respective diameters of the wheels can be minimized. Thus, a dimension of the EC transferring apparatus in a direction perpendicular to the axis line of the shaft member is not increased, and the apparatus enjoys a compact construction.

(2) According to a second feature of the present invention that includes the first feature (1), the component holder comprises a suction nozzle which has a vacuum-supply hole opening at a lower end thereof, and which sucks and holds the electric component by applying vacuum thereto. Since the suction nozzle utilizes vacuum for holding an EC, the EC is not damaged.

(3) According to a third feature of the present invention that includes the second feature (2), the suction nozzle is supported by the lower end portion of the shaft member such that the nozzle is slideable relative to the shaft member in the axial direction thereof, and the component holder further comprises a spring member which is provided between the shaft member and the suction nozzle and which biases the nozzle so that the nozzle projects downward from the lower end portion of the shaft member. The spring member may be a tension coil spring or a compression coil spring. In the present EC transferring apparatus, the elastic deformation of the spring member permits the relative movement of the suction nozzle and the shaft member. The stroke of movement of the shaft member by the air cylinder may be determined to be greater than the distance between a lower end of the suction nozzle supported by the shaft member being positioned at its upper stroke-end position, and an upper surface of each EC. In this case, even when the present apparatus transfers different sorts of ECs having different thickness values, or even if there arises a difference between respective height values of different ECs supplied from different EC supplying devices because of the manufacturing errors of the EC supplying devices, the suction nozzle can reliably contact each EC and suck and hold the EC without damaging it. After the nozzle contacts the EC, the shaft member is further moved downward over a small distance. This downward movement is allowed by the elastic deformation of the spring member. Thus, the difference between the thickness or height values of the ECs is well accommodated.

(4) According to a fourth feature of the present invention that includes any one of the first to third features (1) to (3), the piston is supported by an upper end portion of the shaft member. Since the piston is supported by the upper end portion of the shaft member, the air cylinder can be easily constructed. The piston may be supported by an intermediate portion, or a lower end portion, of the shaft member. In the latter case, however, it is difficult to form the cylinder bore and/or define one or both ends of the stoke of movement of the shaft member. In contrast, in the former case where the piston is supported by the upper end portion of the shaft member, a sleeve may be fitted in a portion of a through-hole formed in the movable member, so that a portion of the support hole is provided by an inner hole of the sleeve, and the cylinder bore may be defined by the remaining portion of the throug-hole. In the last case, the sleeve defines the lower end of the stroke of the shaft member. In this way, the air cylinder is easily constructed.

(5) According to a fifth feature of the present invention that includes any one of the first to fourth features (1) to (4), the piston is produced separately from the shaft member and then is attached to the shaft member.

(6) According to a sixth feature of the present invention that includes any one of the first to fifth features (1) to (5), the piston is not rotatable relative to the shaft member. The piston may be completely fixed to the shaft member, if the piston can be rotated in the cylinder bore when the shaft member is rotated. In this case, the air cylinder enjoys a simple construction. However, the piston may be substantially airtightly attached to the shaft member such that the piston is rotatable relative to the shaft member.

(7) According to a seventh feature of the present invention that includes any one of the first to sixth features (1) to (6), the piston is provided with no sealing member, and is substantially airtightly fitted in the cylinder bore such that substantially no clearance is left between an outer circumferential surface of the piston and an inner circumferential surface of the bore. In this case, without any sealing members, the piston is substantially airtightly fitted in the cylinder bore. Thus, the total number of parts needed to produce the present apparatus is reduced as such. The sealing members would be worn if they would be used with the piston which is rotated with the shaft member and is moved in its axial direction with the same. The present apparatus is free from this problem.

(8) According to an eighth feature of the present invention that includes any one of the first to seventh features (1) to (7), the EC transferring apparatus further comprises a stopper which is supported by the movable member such that the stopper is opposed to an upper end portion of the shaft member, and which defines an upper stroke end of the movement of the shaft member relative to the movable member, one of the stopper and the shaft member including a projection which is buttable against the other of the stopper and the shaft member at a point on the axis line of the shaft member. The projection contacts the other of the stopper and the shaft member, at a single point defined by the tip of the projection. Therefore, when the shaft member is rotated in the state in which the projection is held in contact with the other of the stopper and the shaft member, the shaft member is subjected to a small resistance only. Thus, the shaft member is smoothly rotated. In addition, the wearing of the shaft member and the stopper is minimized.

(9) According to a ninth feature of the present invention that includes any one of the first to eighth features (1) to (8), the EC transferring apparatus further comprises a stopper which is supported by the movable member such that the stopper is opposed to an upper end portion of the shaft member, and which defines an upper stroke end of the movement of the shaft member relative to the movable member, the stopper including a displaceable member which is displaceable relative to the movable member in a direction parallel to the axis line of the shaft member, and a cushion member which is provided between the movable member and the displaceable member. After the shaft member contacts the displaceable member, the shaft member is further moved to displace the displaceable member while compressing the cushion member, and then is stopped. The impact produced when the shaft member butts against the stopper is absorbed by the cushion member, so that the EC is prevented from falling off the shaft member or being dislocated relative to the same. Since the shaft member butts against the cushion member via the displaceable member, the area at which the shaft member contacts the displaceable member can be minimized. For example, in the case where the shaft member includes a projection and the projection directly butts against the cushion member provided by a rubber member, the projection contacts the rubber member via an area enlarged by the elastic deformation of the rubber member. Thus, the shaft member cannot be smoothly rotated. In contrast, since the shaft member butts against the cushion member via the displaceable member, the shaft member can contact the displaceable member via a single point, which assures that the shaft member is smoothly rotated. In addition, the impact produced when the shaft member is stopped is absorbed by the cushion member.

(10) According to a tenth feature of the present invention that includes the ninth feature (9), the cushion member is formed of a vibration damping rubber which absorbs impact of the displaceable member and damps vibration of the displaceable member. In this case, the impact produced when the shaft member is stopped and the vibration produced after the shaft member is stopped are largely reduced, and the EC is prevented from falling off the component holder or being dislocated relative to the holder because of the impact or vibration.

(11) According to an eleventh feature of the present invention that includes any one of the first to tenth features (1) to (10), the movable member comprises a main member having a sleeve-support hole, and a hollow sleeve fitted in the sleeve-support hole, an inner hole of the hollow sleeve defining at least a portion of the support hole of the movable member.

(12) According to a twelfth feature of the present invention that includes the eleventh feature (11), the sleeve is fitted in a lower portion of the sleeve-support hole of the main member, the cylinder bore including an upper portion of the sleeve-support hole.

(13) According to a thirteenth feature of the present invention that includes the twelfth feature (12), the sleeve-support hole of the main member comprises a throug-hole which is formed through the main member, and the apparatus further comprising a closing member which closes an upper opening of the through-hole, the cylinder bore including an upper portion of the through-hole that is defined by, and between, the closing member and an upper end surface of the hollow sleeve.

(14) According to a fourteenth feature of the present invention that includes any one of the first to thirteenth features (1) to (13), the EC transferring apparatus further comprises at least one detectable portion which is substantially integral with the shaft member, and a detector which is supported by the movable member and which detects the detectable portion, the detectable portion and the detector cooperating with each other to provide a stroke-end detector which detects at least one of an upper stroke end and a lower stroke end of the movement of the shaft member relative to the movable member. In response to detection of at least one of the upper stoke end and the lower stroke end of the movement of the shaft member, the component holder may release the EC, or the movable member may start moving. Thus, the component holder is prevented from releasing the EC before the shaft member reaches its lower stroke end, and the movable member is prevented from starting moving before the shaft member reaches its upper stroke end. That is, the component holder is assuredly prevented from interfering with other members.

(15) According to a fifteenth feature of the present invention that includes any one of the first to fourteenth features (1) to (14), the movable member has at least one pressurized-air supply-and-relief passage which is communicated with the air-pressure-operated cylinder device.

(16) According to a sixteenth feature of the present invention that includes any one of the first to fifteenth features (1) to (15), the shaft member and the movable member have respective vacuum-supply passages which are kept communicated with each other while the shaft member is rotated, and is moved in the axial direction thereof, relative to the movable member, and the vacuum-supply hole of the suction nozzle is connected to the respective vacuum-supply passages of the shaft member and the movable member. When the shaft member is rotated, the phase thereof relative to the movable member changes; and when the shaft member is moved in its axial direction, the position thereof relative to the movable member also changes. However, the vacuum-supply hole of the suction nozzle is kept supplied with vacuum or negative air pressure. Thus, the EC is prevented from falling off the suction nozzle.

(17) According to a seventeenth feature of the present invention that includes any one of the first to sixteenth features (1) to (16), the EC transferring apparatus comprises a plurality of the shaft members, the movable member having a plurality of the support holes which support the plurality of shaft members, respectively, on a circle whose center is positioned on an axis line of the drive wheel about which the drive wheel is rotatable; and a plurality of the driven wheels each of which is substantially integral with a corresponding one of the plurality of shaft members, the drive wheel being meshed with the plurality of the driven wheels to simultaneously rotate the driven wheels. Since each of the shaft members is provided in series with an air cylinder in the axial direction of the each shaft member, a dimension of the each shaft member and the air cylinder in their radial direction is small. In addition, the drive wheel and a rotating device for rotating the drive wheel can be used commonly for the plurality of shaft members. Thus, a dimension of the present apparatus as a whole in a direction perpendicular to the axial direction of the shaft members can be reduced. Therefore, the present EC transferring apparatus enjoys a low production cost and a compact construction.

(18) According to an eighteenth feature of the present invention, there is provided an electric-component mounting system comprising an electric-component mounting apparatus comprising an electric-component transferring apparatus according to any one of the first to seventeenth features (1) to (17); an electric-component supplying device which supplies electric components to the electric-component mounting apparatus; and a board supporting device which supports a printed circuit board on which the electric components are mounted by the electric-component mounting apparatus.

(19) According to a nineteenth feature of the present invention that includes the eighteenth feature (18), the moving device of the electric-component transferring apparatus moves the movable member in each of a first direction parallel to an X axis and a second direction parallel to a Y axis, the X and Y axes being perpendicular to each other on a substantially horizontal plane.

(20) According to a twentieth feature of the present invention that includes the nineteenth feature (19), the board supporting device comprises a printed-circuit-board conveying device which conveys the printed circuit board along a straight reference line and stops the board at a position corresponding to the electric-component transferring apparatus.

(21) According to a twenty-first feature of the present invention that includes the twentieth feature (20), the electric-component mounting apparatus comprises a plurality of component mounting units which are arranged along a straight line parallel to the reference line and each of which has a component-mount region in which the each component mounting unit is allowed to mount electric components on the printed circuit board, and the printed-circuit-board conveying device conveys, along the reference line, the printed circuit board at a predetermined convey pitch which is not longer than a length of the component-mount region of the each component mounting unit.

(22) According to a twenty-second feature of the present invention that includes the twenty-first feature (21), the electric-component supplying device comprises a plurality of unit groups each of which comprises a plurality of component supplying units, each of the plurality of component supplying units storing electric components of a corresponding one of a plurality of sorts, and including a component-supply portion from which the each component supplying unit supplies the electric components one by one, the plurality of component supplying units of the each unit group being arranged along a straight line parallel to the reference line, the plurality of component mounting units corresponding to the plurality of unit groups, respectively.

(23) According to a twenty-third feature of the present invention that includes any one of the eighteenth to twenty-second features (18) to (22), the electric-component transferring apparatus comprises at least one pair of the component holders each of which sucks and holds an electric component supplied from the electric-component supplying device, by applying vacuum to the electric component; the movable member supporting the one pair of component holders; an image taking device which has a square range of view and which takes respective images of the electric components held by the one pair of component holders; an error detecting and correcting device which is connected to the image taking device and which detects and corrects, based on the taken image of each of the electric components held by the one pair of component holders, at least one of (a) a positional error of the each electric component from a reference position in at least one direction parallel to a plane on which the printed circuit board is supported by the board supporting device and (b) an angular error of the each electric component from a reference angular position about an axis line perpendicular to the plane, so that the electric components are mounted on the printed circuit board after the at least one of the positional error and the angular error of the each electric component is corrected; the moving device moving the movable member from a component-receive position where each of the component holders of the one pair is opposed to the electric-component supplying device, to a component-mount position where the each component holder mounts the electric component on the printed circuit board supported by the board supporting device, via an image-take position where the movable member is stopped by the moving device such that respective axis lines of the component holders of the one pair perpendicularly intersect one of two diagonal lines of the square range of view of the image taking device, at respective positions which are axis-symmetric with each other with respect to an optical axis of the image taking device, so that the image taking device simultaneously takes the respective images of the electric components held by the one pair of component holders.

(24) According to a twenty-fourth feature of the present invention, there is provided a method of taking respective images of a plurality of electric components, comprising the steps of positioning a pair of component holders each of which sucks and holds an electric component by applying vacuum thereto, relative to an image taking device having a square range of view, such that respective axis lines of the two component holders of the pair perpendicularly intersect one of two diagonal lines of the square range of view of the image taking device, at respective positions which are axis-symmetric with each other with respect to an optical axis of the image taking device, and operating the image taking device to simultaneously take respective images of the electric components held by the pair of component holders. The two ECs held by the two component holders falls within the range of view of the image taking device, and the respective images of the two ECs are simultaneously taken by the image taking device. Therefore, the present method improves the efficiency of taking EC images, as compared with a method in which an image taking device takes an image of only a single EC at one time. The optical axis of the image taking device coincides with the center of the range of view thereof. Since the two component holders are aligned with one of the two diagonal lines of the range of view, at the respective positions axis-symmetric with each other with respect to the optical axis, the two holders can be prevented from interfering with each other. In addition, since the two component holders can be positioned within the limited or narrow range of view of the image taking device, the narrow range of view can be efficiently utilized. Moreover, the present method can be used for simultaneously taking respective images of a pair of ECs of any sort in a wide range of dimensions or sizes. Thus, the present method largely improves the EC-image taking efficiency by simultaneously taking respective images of two ECs.

(25) According to a twenty-fifth feature of the present invention that includes the twenty-fourth feature (24), the step of positioning the pair of component holders comprises moving a single movable member which supports a plurality of pairs of the component holders, and sequentially positioning each pair of component holders of the plurality of pairs of component holders, relative to the image taking device, such that respective axis lines of the component holders of the each pair perpendicularly intersect a corresponding one of the two diagonal lines of the square range of view of the image taking device, at respective positions which are axis-symmetric with each other with respect to the optical axis of the image taking device, and the step of operating the image taking device comprises operating the image taking device to simultaneously take respective images of the electric components held by the each pair of component holders. After respective images of two ECs held by one pair of component holders are taken by the image taking device, the movable member is moved and stopped so that respective images of two ECs held by another, or the other, pair of component holders are taken. Even through the movable member may support a great number of pairs of component holders, the present method reduces, to half, the time needed for taking respective images of all ECs, as compared with the method in which an image of only a single EC is taken at one time. Thus, the present method improves the EC-image taking efficiency. In the case where the movable member supports the plurality of pairs of component holders such that a straight line which perpendicularly intersects the respective axis lines of the two component holders of each pair is parallel to a corresponding one of the two diagonal lines of the range of view, the two component holders of the each pair can be easily positioned relative to the range of view. However, it is not essentially required that the movable member support the plurality of pairs of component holders such that all the straight lines for the plurality of pairs of component holders are parallel to the corresponding diagonal lines of the range of view. For example, in the case where the movable member is provided by a rotatable member, the movable member may support the plurality of pairs of component holders such that one or more of the straight lines for the plurality of pairs of component holders are not parallel to the corresponding diagonal lines of the range of view. In this case, however, the straight line which perpendicularly intersects the respective axis lines of the two component holders of each pair can be made parallel to the corresponding one of the two diagonal lines, by rotating the rotatable member. That is, the rotatable member can be stopped at a position where the respective axis lines of the component holders of each pair perpendicularly intersect the corresponding one of the two diagonal lines of the square range of view of the image taking device, at the respective positions axis-symmetric with each other with respect to the optical axis of the image taking device.

(26) According to a twenty-sixth feature of the present invention, there is provided an electric-component mounting system comprising a circuit-substrate supporting device which supports a circuit substrate; an electric-component supplying device which supplies electric components; at least one pair of component holders each of which sucks and holds an electric component supplied from the electric-component supplying device, by applying vacuum to the electric component; a movable member which supports the one pair of component holders; an image taking device which has a square range of view and which takes respective images of the electric components held by the one pair of component holders; an error detecting and correcting device which is connected to the image taking device and which detects and corrects, based on the taken image of each of the electric components held by the one pair of component holders, at least one of (a) a positional error of the each electric component from a reference position in at least one direction parallel to a plane on which the circuit substrate is supported by the circuit-substrate supporting device and (b) an angular error of the each electric component from a reference angular position about an axis line perpendicular to the plane, so that the electric components are mounted on the circuit substrate after the at least one of the positional error and the angular error of the each electric component is corrected; a moving device which moves the movable member from a component-receive position where each of the component holders of the one pair is opposed to the electric-component supplying device, to a component-mount position where the each component holder mounts the electric component on the circuit substrate supported by the circuit-substrate supporting device, via an image-take position where the moving device stops the movable member such that respective axis lines of the component holders of the one pair perpendicularly intersect one of two diagonal lines of the square range of view of the image taking device, at respective positions which are axis-symmetric with each other with respect to an optical axis of the image taking device, so that the image taking device simultaneously takes the respective images of the electric components held by the one pair of component holders. The movable member may be a linearly movable member which is linearly movable in at least one of an X-axis direction and a Y-axis direction which are perpendicular to each other on a plane perpendicularly intersecting the respective axis lines of the two component holders. Otherwise, the movable member may be one or ones which supports or support the pair of component holders such that the component holders are revolved about a common axis line. In the latter case, the present EC mounting system may include a component-holder positioning device which sequentially positions the component holders at at least one predetermined operation position on the locus of revolution of the holders. The component-holder positioning device may be one which is disclosed in Japanese Patent Application laid open for public inspection under Publication No. 9-237,997 corresponding to U.S. patent application Ser. No. 08/769,700 assigned to the assignee of the present application. The disclosed positioning device includes, as the movable member, a plurality of rotary members which are rotatable about a common axis line, independent of each other, and additionally includes a rotary-motion applying device as a movable-member moving device which applies, to each of the rotary members, such a rotary motion which causes the each rotary member to be fully rotated by 360 degrees about the common axis line, be stopped at least three times during the full rotation, and keep a predetermined time difference from each of its preceding and following rotary members. The plurality of rotary members support the plurality of component holders, respectively, at respective positions equally distant from the common axis line. The rotary-motion applying device may be adapted to stop simultaneously two rotary members at an image-take position as one of the operation positions where respective images of the two ECs held by the two holders supported by the two rotary members are simultaneously taken by the image taking device. Otherwise, each of the plurality of rotary members may support a pair of component holders, and the rotary members may be sequentially stopped at the image-take position where respective images of the two ECs held by the two component holders supported by the each rotary member are simultaneously taken. Otherwise, the component-holder positioning device may be one which is disclosed in Japanese Patent No. 2,644,914. This positioning device includes, as the movable member, an intermittent-rotation body which is intermittently rotatable about an axis line, and additionally includes a rotation-body rotating device as a movable-member moving device that intermittently rotates the rotation body. The rotation body supports the plurality of component holders such that the component holders are equiangularly spaced from each other at a predetermined angular-spacing pitch equal to a predetermined intermittent-rotation pitch at which the rotation body is intermittently rotated by the rotating device. In addition, the rotation body supports the plurality of component holders such that respective axis lines of each pair of adjacent component holders perpendicularly intersect one of the two diagonal lines of the square range of view of the image taking device, at the respective positions axis-symmetric with each other with respect to the optical axis of the image taking device. The intermittent-rotation body may be one which is rotatable in each of opposite directions. The intermittent-rotation body may be replaced with a rotatable body which is rotatable by an arbitrary angle in each of opposite directions. U.S. patent application Ser. No. 08/977,662 assigned to the assignee of the present application discloses a positioning-device moving device which moves the above-described component-holder positioning device as a whole to an arbitrary position on an EC-convey plane which bridges the circuit-substrate ("CS") supporting device and the EC supplying device. In the latter case, the positioning-device moving device cooperates with the rotary-motion applying device and the rotation-body rotating device to provide the movable-member moving device. The present EC mounting system performs the same number of EC-image taking operations as the number of "pairs" of the component holders. Therefore, the present system reduces, to half, the time needed for taking respective images of all ECs, as compared with a method in which an image of only one EC is taken at one time. Thus, the present system can mount ECs on CSs with high efficiency. The positional error of the EC held by each component holder from the reference position may be corrected by correcting the distance of movement of the movable member, or correcting the position where the CS is positioned by the CS supporting device. The angular error of the EC held by each component holder from the reference angular position is an angular- or rotation-position error of the EC about its own axis line. In the case where the movable member supports the component holders such that each of the component holders is rotatable relative to the movable member, according to the twenty-seventh feature (27) described below, the angular error of the EC held by the each component holder may be corrected by operating a holder rotating device to rotate the each holder about its axis line. In the last case, the holder rotating device may be provided on the movable member, or otherwise may be provided, separately from the movable member, at a holder-rotate position fixed on a route along which the movable member is moved by the movable-member moving device.

(27) According to a twenty-seventh feature of the present invention that includes the twenty-sixth feature (26), the EC mounting system comprises a plurality of pairs of the component holders which are supported by the movable member such that each of the component holders is rotatable relative to the movable member. In the present system, the angular error of the EC held by each component holder may be corrected by rotating the each component holder. More specifically, based on a batch of image data representative of the image of the EC taken by the image taking device, the error detecting and correcting device calculates the positional error and the angular error of the EC. This angular error is corrected by rotating the each holder holding the EC. In the case where the plurality of component holders are rotated by a common drive wheel and a common rotating device, according to the twenty-eighth feature (28) described below, the component holders are provided on a single circle whose center is positioned on the axis line of rotation of the drive wheel. However, so long as each of the component holders can be rotated, it is not essentially required that the component holders be provided on a single circle, that is, it is possible that the component holders be provided at respective arbitrary positions.

(28) According to a twenty-eighth feature of the present invention that includes the twenty-seventh feature (27), the EC mounting system further comprises a drive wheel which is supported by the movable member such that the drive wheel is rotatable about an axis line; a rotating device which is supported by the movable member and which rotates the drive wheel about the axis line; the plurality of pairs of component holders being supported by the movable member such that respective axis lines of the component holders about which the component holders are rotatable, respectively, perpendicularly intersect a circle whose center is located on the axis line of rotation of the drive wheel; and a plurality of driven wheels each of which is substantially integral with a corresponding one of the component holders, the drive wheel being meshed with the driven wheels to simultaneously rotate the driven wheels. When the drive wheel is rotated, the driven wheels meshed with the drive wheel are simultaneously rotated so that all the component holders are simultaneously rotated about their own axis lines, respectively. The angular error of the EC held by each of the component holders may be corrected by rotating the each holder about its own axis line. After the current EC is mounted on the CS, the next EC following the current EC is rotated to correct its angular error. However, when the next holder holding the next EC is rotated by a certain angle, the other holders are also rotated by the same angle. Therefore, the current angular position of each of the second and following ECs includes a correcting angle or angles used to rotate the preceding EC or ECs to correct its or their angular error or errors. Thus, the angular error of each of the second and following ECs is corrected by rotating the drive wheel by a correcting angle and in a correcting direction. The correcting angle and direction are determined by taking into account the correcting angle or angles for its preceding EC or ECs. The correcting direction may be selected as one of opposite directions in such a manner that the drive wheel is rotated in the selected one direction, by the correcting angle which is smaller than an angle by which the drive wheel is rotated in the other direction. Since the drive wheel and the rotating device are supported by the movable member, the angular error of the EC held by each of the component holders may be corrected while the movable member is moved. In addition, since the drive wheel and the rotating device are commonly to the plurality of component holders, the present EC mounting system enjoys a low manufacturing cost.

(29) According to a twenty-ninth feature of the present invention that includes the twenty-eighth feature (28), the axis line of rotation of the drive wheel is parallel to the respective axis lines of rotation of the component holders. The above-identified U.S. patent application Ser. No. 08/977,662 discloses, as the movable member, a rotatable body which is rotatable about an axis line and which supports the plurality of pairs of component holders such that each pair of holders extend along a corresponding one of a plurality of generating lines of a conical surface whose center line coincides with the axis line of rotation of the rotatable body. In this case, the axis line of rotation of the rotatable body is inclined relative to a vertical line by an angle at which one of the generating lines of the conical surface perpendicularly intersects a horizontal plane along which a CS supporting device and an EC supplying device provided. The respective axis lines of rotation of the component holders are inclined relative to the axis line of rotation of the drive wheel that is parallel to the axis line of rotation of the rotatable body. Each of the component holders holds and mounts an EC at a position where the axis line of the each component holder is parallel to the vertical line. The image taking device takes EC images at a position where the axis line of the each component holder is inclined relative to the vertical line or the horizontal plane, and the range of view of the image taking device is inclined relative to the horizontal plane. In this case, when the image taking device simultaneously takes respective images of two ECs held by each pair of adjacent component holders at the image-take position, the respective postures or attitudes of the two ECs are inclined by a small angle, because of their own weights, relative to a plane perpendicular to the optical axis of the image taking device. In contrast, in the present EC mounting system, the axis line of rotation of the drive wheel is parallel to the respective axis lines of rotation of the component holders. Therefore, the present system is free from the above-indicated problem.

(30) According to a thirtieth feature of the present invention that includes any one of the twenty-seventh to twenty-ninth features (27) to (29), the plurality of pairs of component holders are located on a circle whose center is located on the axis line of rotation of the drive wheel, such that one pair of component holders are spaced from another pair of component holders by 90 degrees about the axis line of rotation of the drive wheel. The movable member may support two, three, or four pairs of component holders, i.e., four, six, or eight component holders in total. It is not essentially required that one pair of component holders be spaced from another, or the other, pair of component holders by 90 degrees about the axis line of rotation of the drive wheel. However, in the case where two or more pairs of holders are spaced from each other by 90 degrees, a straight line which perpendicularly intersects the respective axis line of one pair of holders is parallel, or perpendicular, to a straight line which perpendicularly intersects the respective axis line of another, or the other, pair of holders. Therefore, each of the two or more pairs of holders can be positioned on a corresponding one of the two diagonal lines of the range of view, by just translating the movable member without having to rotating the same.

(31) According to a thirty-first feature of the present invention that includes any one of the twenty-sixth to thirtieth features (26) to (30), the moving device moves the movable member in each of an X-axis direction parallel to an X axis and a Y-axis direction parallel to a Y axis, the X axis and the Y axis being perpendicular to each other on a plane parallel to a support plane on which the circuit substrate is supported by the circuit-substrate supporting device.

BRIEF DESCRIPTION OF THE DRAWINGS

The above and optional objects, features, and advantages of the present invention will be better understood by reading the following detailed description of the preferred embodiments of the invention when considered in conjunction with the accompanying drawings, in which.

DETAILED DESCRIPTION OF THE PREFERRED EMBODIMENTS

Hereinafter, there will be described an electric-component ("EC") mounting system 8 including an EC mounting device 23, to which the present invention is applied. The present EC mounting system 8 carries out an EC-image taking method to which the present invention is also applied.

Figure 1:
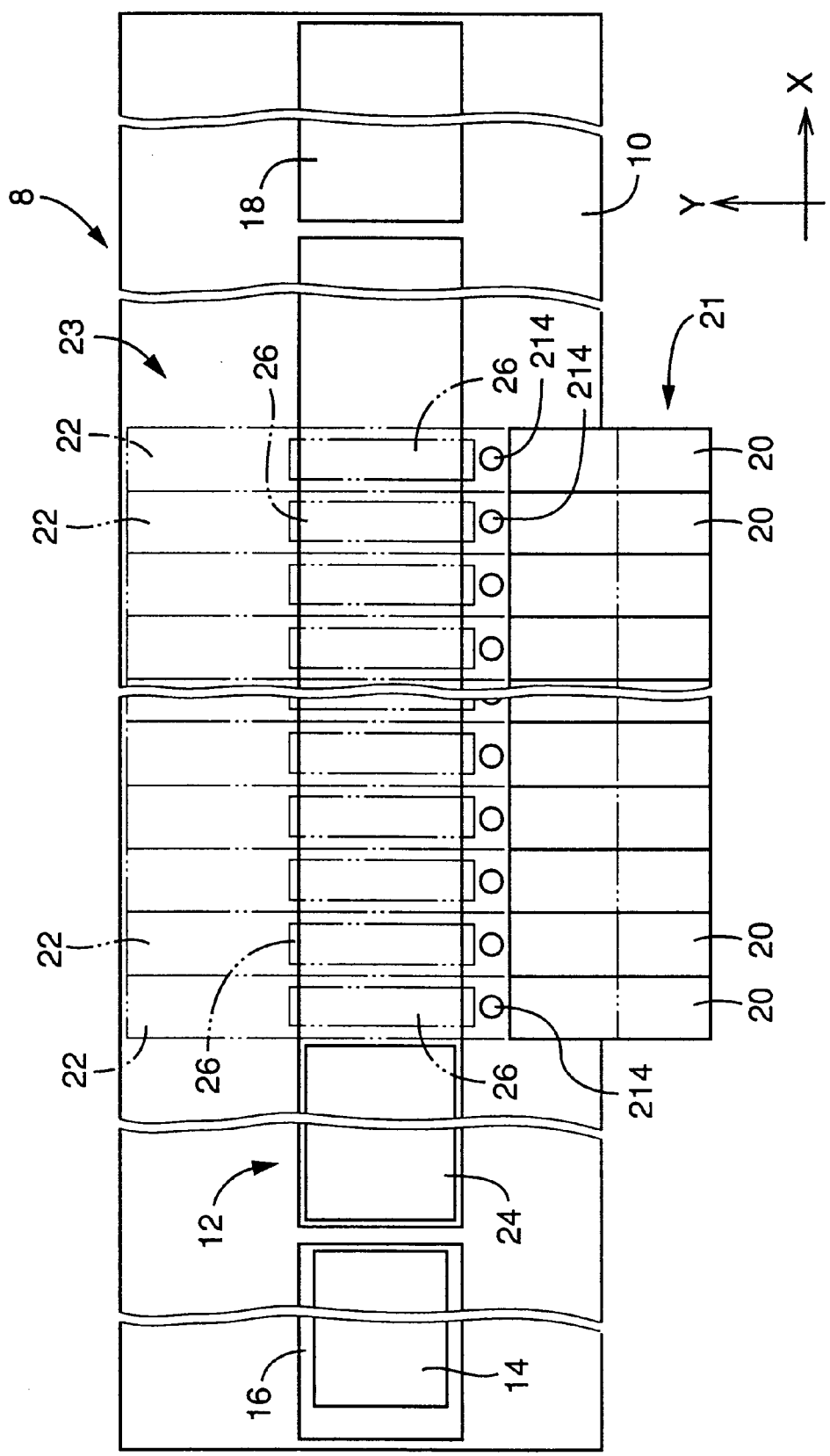
FIG. 1 is a plan view of an electric-component ("EC") mounting system to which the present invention is applied.

As shown in FIG. 1, the present EC mounting system 8 includes a bed 10; a board supporting and conveying device 12 which is provided on the bed 10; a board carry-in device 16 which carries in a printed circuit board ("PCB") 14 as a circuit substrate on which ECs 96 are mounted, and passes the PCB 14 to the board supporting and conveying device 12; a board carry-out device 18 which receives the PCB 14 from the board supporting and conveying device 12 and carries out the PCB 14; an EC supplying device 21 including a plurality of groups of EC supplying units 20 (in the present embodiment, sixteen supply-unit groups 20); and the EC mounting device 23 including a plurality of EC mounting units 22 (in the present embodiment, sixteen mounting units 22).

The board supporting and conveying device 12 includes a plurality of board support members 24 each of which supports a PCB 14. The board support members 24 are arranged in an array, and each board support member 24 defines a horizontal circuit-substrate support plane on which a PCB 14 is supported. A board-support-member moving device (not shown) intermittently moves all the board support members 24 at a predetermined pitch along a straight line along which the board support members 24 are arranged. Thus, the PCBs 14 supported on the board support members 24 are conveyed along the straight line. Each of the board support members 24 provides a circuit-substrate supporting device. The board supporting and conveying device 12 has a construction similar to that of a board supporting and conveying device disclosed in Japanese patent application laid open for public inspection under Publication No. 7(1995)-45995. Since the board supporting and conveying device 12 is not essentially related to the present invention, no more detailed description thereof is provided.

The sixteen EC mounting units 22 are arranged, without any spaces left therebetween, in a horizontal direction in which the board supporting and conveying device 12 conveys the PCBs 14 (hereinafter, this direction will be referred to as the "board-convey direction" or the "X-axis direction"). A dimension of each EC mounting unit 22 in the board-convey direction is smaller than that of the PCB 14. Each EC mounting unit 22 is allowed to mount ECs 96 on each PCB 14, only within an EC-mount region 26 thereof.

A dimension of each EC-mount region 26 in the board-convey direction is smaller than that of each EC mounting unit 22. Thus, each EC mounting unit 22 mounts prescribed sorts of ECs 96 on only a portion of the PCB 14 that is located within its EC-mount region 26. In the present EC mounting system 8, two or more of the sixteen EC mounting units 22 concurrently mount ECs 96 on a single PCB 14, which leads to improving the efficiency of mounting of ECs 96.

A dimension of each EC-mount region 26 in a direction (hereinafter, referred to as the "Y-axis direction") perpendicular to the board-convey direction on a horizontal plane parallel to the respective circuit-substrate support planes of the board support members 24, is larger than that of a PCB 14 of the largest size. A dimension of the PCB 14 in the board-convey direction may be larger, or smaller, than the sum of respective dimensions of the sixteen EC mounting units 22 in the same direction. When the current sort of PCBs 14 are changed to another sort of PCBs 14, the current sort of board support members 24 whose size corresponds to that of the current sort of PCBs 14 are changed to another sort of board support members 24 whose size corresponds to that of the next sort of PCBs 14. In the present embodiment, the dimension of each EC mounting unit 22 in the board-convey direction is eight times, 8P, as large as the smallest pitch, P, at which the board-support member moving device intermittently moves the board support members 24 along the straight line, and the dimension of each EC-mount region 26 is 5P. Thus, the distance between each pair of adjacent EC-mount regions 26 is 3P. In the present embodiment, however, it is assumed that the board supporting and conveying device 12 intermittently conveys the PCBs 14 at a predetermined pitch, 4P, that is four times as large as the smallest pitch P. Thus, the board supporting and conveying device 12 moves each PCB 14 over a distance smaller than the width of each EC-mount region 26, i.e., the dimension of the same 26 in the board-convey direction, and subsequently stops the each PCB 14. Thus, any portion of each PCB 14 can be located within each of the sixteen EC-mount regions 26, so that each of the sixteen EC mounting units 22 can mount ECs 96 on the each PCB 14. However, the board supporting and conveying device 12 can convey PCBs 14 at a pitch larger or smaller than 4P.

The present EC mounting system 8 additionally includes a returning device (not shown) which returns each board support member 24 to the board carry-in device 16 after all ECs 96 have been mounted on the PCB 14 supported on the each board support member 24. Opposite end portions of the board supporting and conveying device 12 in the board-convey direction extend over corresponding opposite end portions of the EC mounting device 23, that is, the sixteen EC mounting units. 22. The upstream-side end portion of the device 12 in the board-convey direction provides a waiting area, and the downstream-side end portion of the same 12 provides a board-unload area where the PCB 14 is unloaded from the board support member 24 and is transferred to the board carry-out device 18 and the board support member 24 is transferred to the returning device. The returning device returns the board support member 24 to a position adjacent to the waiting area where the board support member 24 is transferred to the board supporting and conveying device 12. The board carry-in device 16 carries in a PCB 14 and passes the PCB 14 onto the board support member 24.

Above the waiting area, there is provided a reference-mark-image taking device 28 (FIG. 10) which takes respective images of a plurality of reference marks affixed to each PCB 14. The taking device 28 includes a CCD (charge coupled device) camera, and a camera moving device which moves the CCD camera to an arbitrary position on a horizontal plane, so that the CCD camera takes an image of each of the reference marks (in the present embodiment, two reference marks are provided on a diagonal line of each rectangular PCB 14). Based on image data representative of the taken images of the reference marks, a control device 200 (FIG. 10) calculates respective positional errors of each of a plurality of EC-mount places on each PCB 14 in the X-axis and Y-axis directions. Those positional errors of each EC-mount place are corrected when an EC 96 is mounted at the each place on the PCB 14, in the manner described later.

Figure 2:
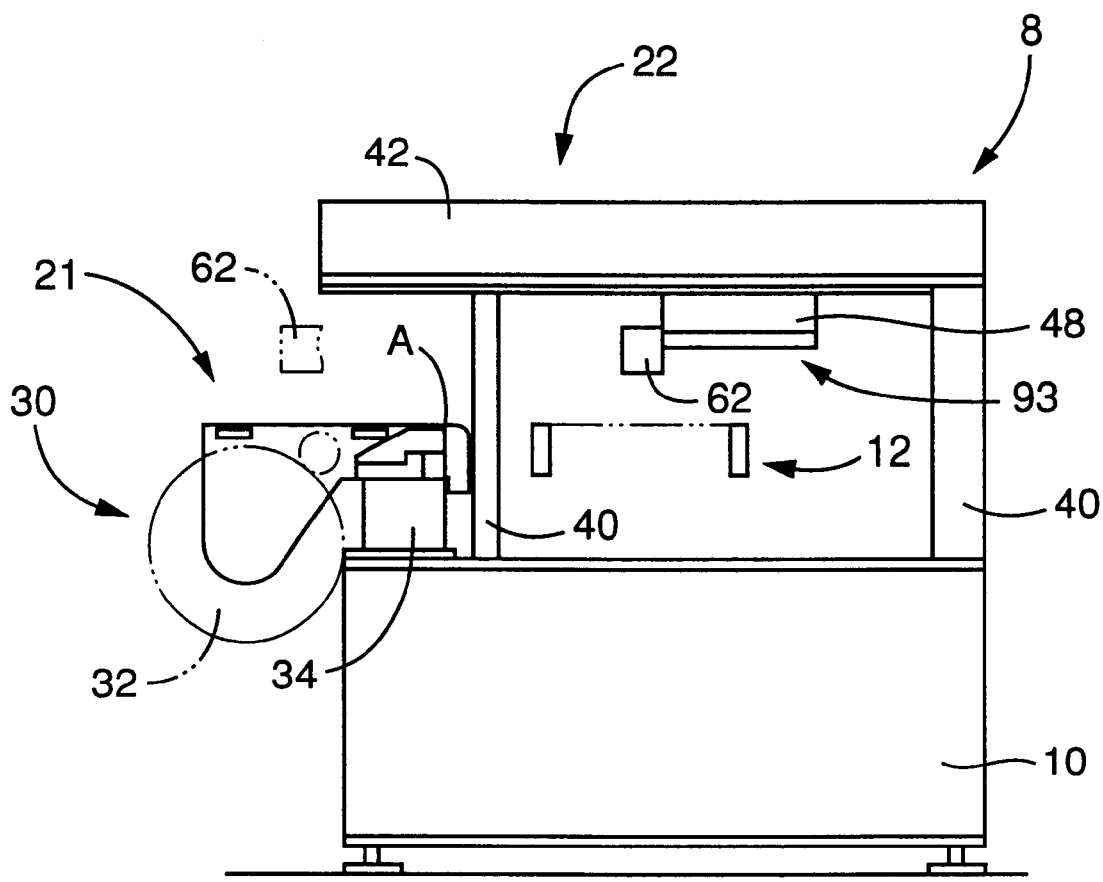
FIG. 2 is a side elevation view of the EC mounting system of FIG. 1.

The sixteen supply-unit groups 20 correspond to the sixteen EC mounting units 22, respectively. Each supply-unit group 20 includes a plurality of EC supplying units 30 one of which is shown in FIG. 2. Each EC supplying unit 30 supplies ECs 96 in the form of an EC carrier tape. More specifically described, the EC carrier tape includes an EC accommodating tape having a number of EC accommodating pockets at a predetermined pitch in a lengthwise direction thereof, a number of ECs accommodated in the pockets, respectively, and a cover tape adhered to the accommodating tape to close respective openings of the pockets.

Each EC supplying unit 30 includes a tape reel 32 on which the EC carrier tape is wound, and a tape feeding device (not shown) which feeds the EC carrier tape at a predetermined pitch so that the leading one of the ECs 96 from which the cover tape has been peeled is moved to a predetermined component-supply position, A. A portion of each EC supplying unit 30 in the vicinity of the component-supply position A is a component-supply portion of the each unit 30. The component-supply portion includes the component-supply position A. The plurality of EC supplying units 30 of each supply-unit group 20 are mounted on a unit support table 34 fixed to the bed 10, such that the respective component-supply portions of the EC supplying units 30 are arranged along a straight line parallel to the board-convey direction. Thus, each of the EC mounting units 22 can receive ECs 96 from the EC supplying units 30 of a corresponding one of the supply-unit groups 20. The EC supplying units 30 may be replaced with ones each of which includes a casing for storing ECs and utilizes vibration, inclination, air flow, or one or more conveyor belts, or any combination thereof, for feeding the ECs in an array to its component-supply portion from which the ECs are supplied one by one.

An upper surface of the PCB 14 supported on the board supporting and conveying device 12 is substantially level with respective upper surfaces of the ECs 96 fed on each EC supplying unit 30. It is preferred that the EC supplying units 30 of the sixteen supply-unit groups 20 be arranged such that the sixteen EC mounting units 22 can mount substantially the same amount of ECs 96 on the PCB 14.

Since the sixteen EC mounting units 22 have an identical construction, one of the mounting units 22 will be described below as a representative of the units 22.

Figure 3:
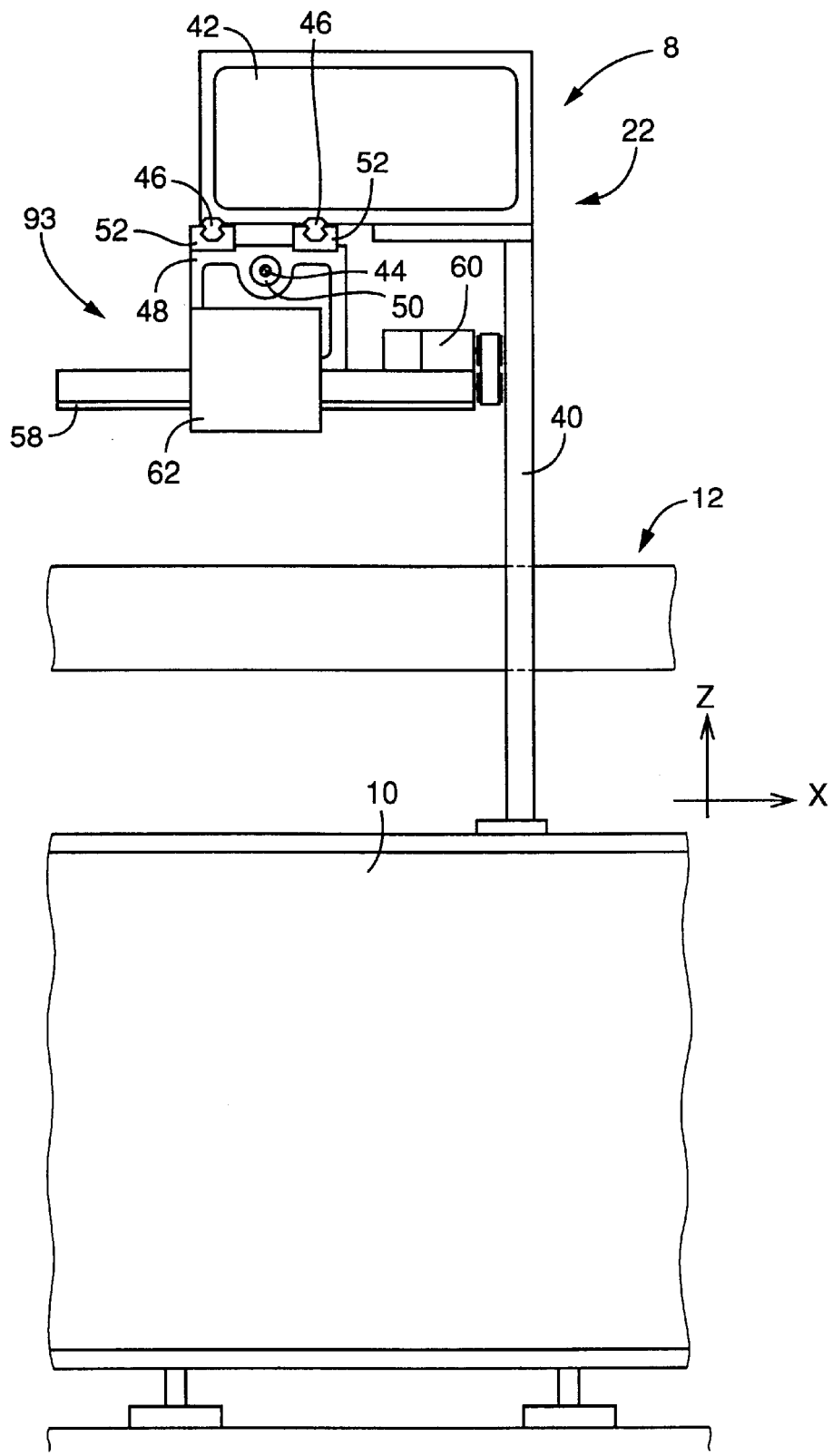
FIG. 3 is a front elevation view of an EC mounting unit of an EC mounting device of the EC mounting system of FIG. 1.

As shown in FIGS. 2 and 3, two columns 40 stand on the bed 10, such that the two columns 40 are distant from each other in the Y-axis direction. A beam 42 is fixed to the columns 40 such that the beam 42 extends parallel to the Y-axis direction. A pair of straight guide rails 46 each as a guide member are fixed to a lower surface of the beam 42, and a ball screw 44 as a feed member is provided below the lower surface of the beam 42, such that the guide rails 46 and the ball screw 44 extend in the Y-axis direction. A Y-axis slide 48 is provided with a nut 50 which is threadedly engaged with the ball screw 44, and is also provided with a pair of guide blocks 52 (each as a guided member) which are slideably fitted on the pair of guide rails 46, respectively. When the ball screw 44 is rotated by a Y-axis servomotor 54 (FIG. 10), the Y-axis slide 48 is moved in the Y-axis direction.

The Y-axis slide 48 is provided with a ball screw (not shown) as a feed member and a pair of straight guide rails 58 (only one 58 is shown in FIG. 3) each as a guide member, such that the ball screw and the guide rails 58 extend in the X-axis direction. When the ball screw is rotated by an X-axis servomotor 60 (FIG. 3), an X-axis slide 62 is moved in the X-axis direction while being guided by the pair of guide rails 58.

Figure 4:
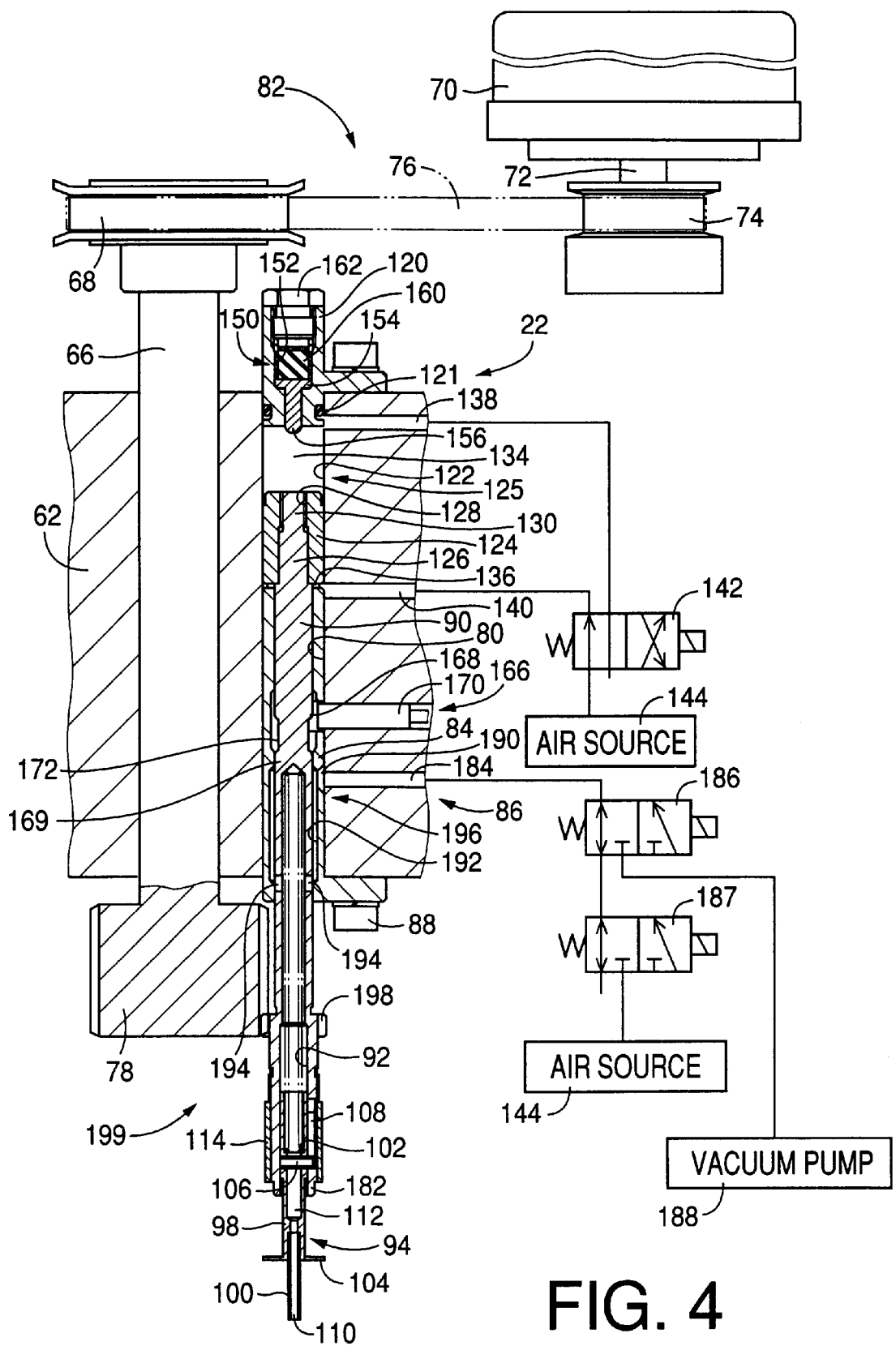
FIG. 4 is a cross-sectioned, front elevation view of a sucker-support shaft member of the EC mounting unit of FIG. 3.

As shown in FIG. 4, the X-axis slide 62 has a hole in which a rotary shaft member is fitted such that the rotary shaft member 66 is rotatable about a vertical axis line and is not movable in an axial direction parallel to the axis line. A driven pulley 68 is fixed to an upper end portion of the rotary shaft member 66 that projects upward from the X-axis slide 62. The driven pulley 68 is provided by a timing pulley, and receives rotation of a nozzle-rotating servomotor 70 via a drive pulley 74 fixed to an output shaft 72 of the servomotor 70, and a timing or cog belt 76. Thus, the rotary shaft member 66 can be rotated by an arbitrary angle in each of opposite directions. The drive pulley 74 is also provided by a timing pulley. A lower end portion of the rotary shaft member 66 that projects downward from the X-axis slide 62 supports a drive wheel 78 such that the drive wheel 78 is integral, and concentric, with the shaft member 66. In FIG. 3, the rotary shaft member 66, the nozzle-rotating servomotor 70, and the other members supported by the X-axis slide 62 are not shown. When the shaft member 66 is rotated by the servomotor 70, the drive wheel 78 is rotated about the vertical axis line. The rotary shaft member 66 and the nozzle-rotating servomotor 70 cooperate with a rotation transmitting device including the drive and driven pulleys 74, 68 and the timing belt 76, to provide a rotating device 82 which rotates the drive wheel 78.

Figure 6:
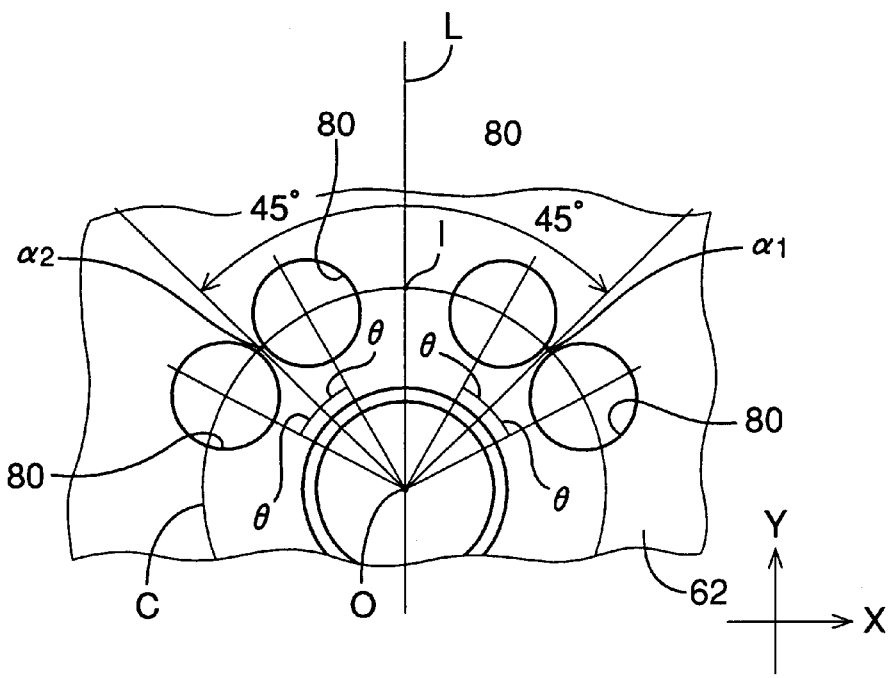
FIG. 6 is a plan view for explaining the manner in which a plurality of support holes in which a plurality of sucker-support shaft members are fitted, respectively, are provided relative to one another.
Figure 7:
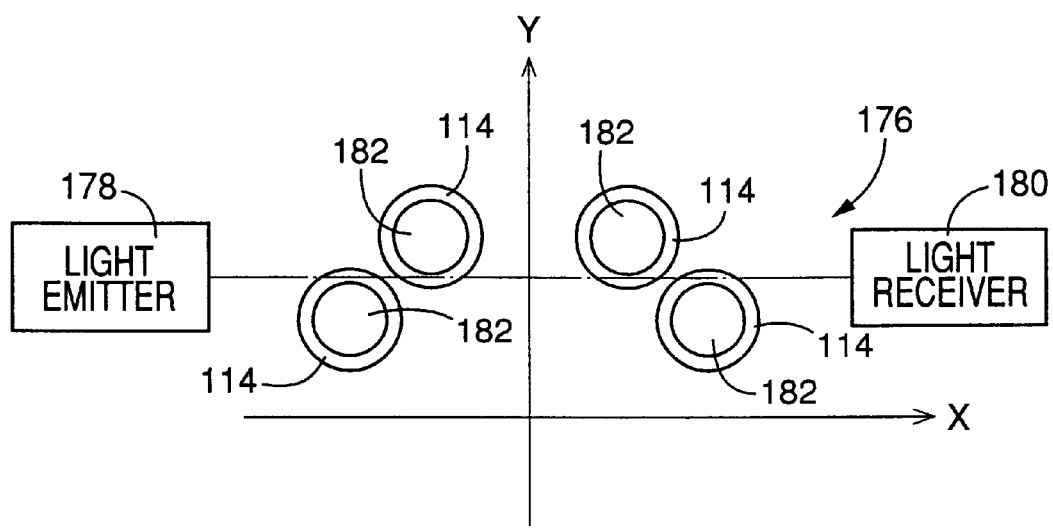
FIG. 7 is a view of a photoelectric sensor which detects an upper stroke-end position of each of the sucker-support shaft members.

As shown in FIG. 6, the X-axis slide 62 has a plurality of support holes 80 (in the present embodiment, four support holes 80) on a circle, C, whose center is located on the axis line, O, of the drive wheel 78 (or the rotary shaft member 66). More specifically described, two support holes 80 are formed at respective angular positions, +θ, with respect to each of two angular positions, α1, α2, distant by ±45 degrees from a point of intersection, I, of the circle C and a straight line, L, which perpendicularly intersects the axis line O of the drive wheel 78 and extends parallel to the Y-axis direction. The first pair of support holes 80 associated with the first angular position α1 is distant by 90 degrees from the second pair of support holes 80 associated with the second angular position α2. As shown in FIG. 7, one of the two support holes 80 of the first pair and one of the two support holes 80 of the second pair have an identical first position in the Y-axis direction, and the other support hole 80 of the first pair and the other support hole 80 of the second pair have an identical second position, different from the first position, in the Y-axis direction. The four support holes 80 of the two first and second pairs have respective different positions in the Xaxis direction. A straight line which perpendicularly intersects respective center lines of the two support holes 80 of each of the first and second pairs are inclined by 45 degrees with respect to each of the X and Y axes. In the present embodiment, the respective angular positions ±θ are ±16.43 degrees. The manner in which the angle θ is determined will be described later.

Figure 5:
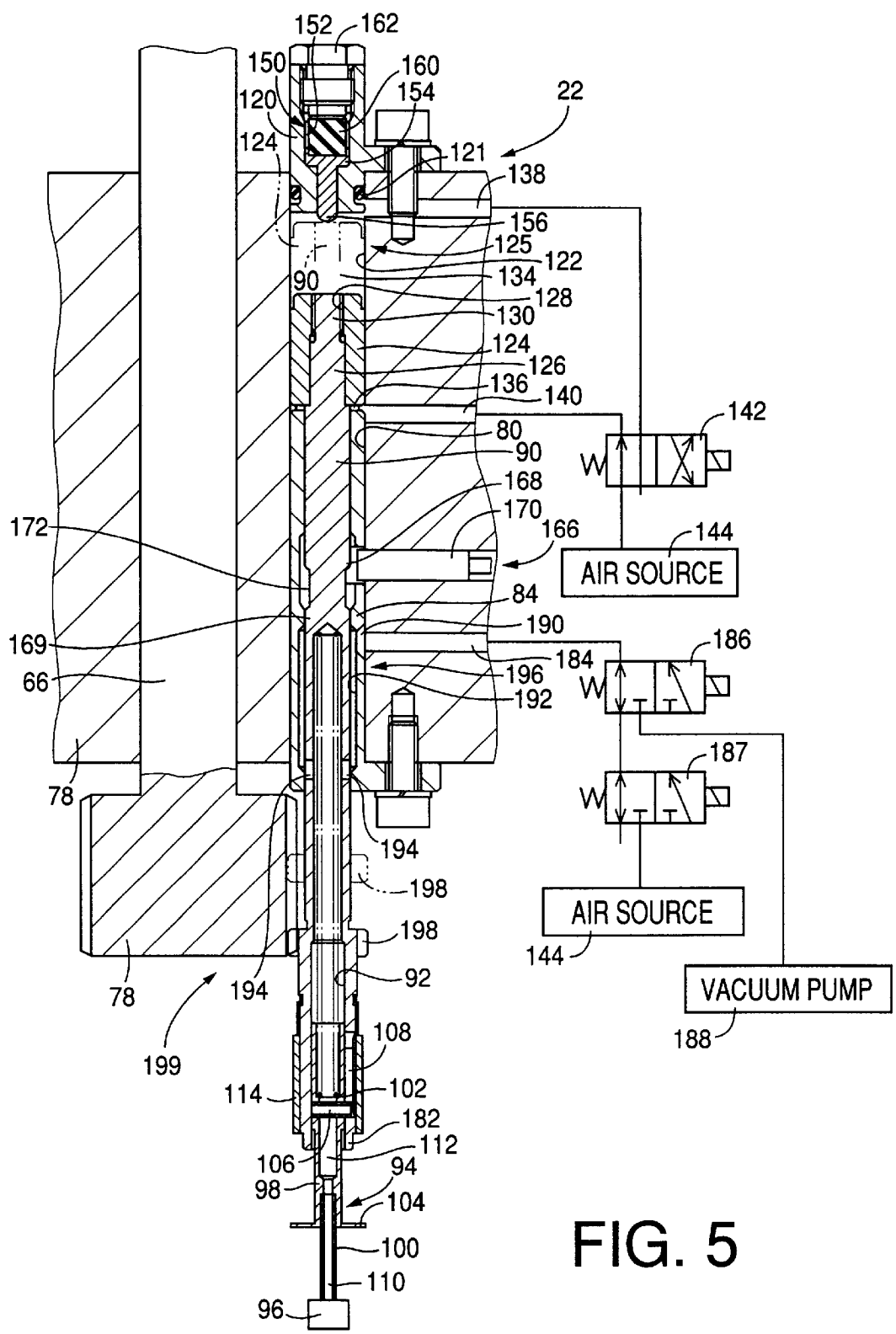
FIG. 5 is a cross-sectioned, front elevation view of the sucker-support shaft member and its peripheral members.

Hereinafter, one of the four support holes 80 will be described as a representative thereof, by reference to FIGS. 4 and 5. One support hole 80 shown in FIGS. 4 and 5 is a through-hole which is formed through the thickness of the X-axis slide 62 such that the through-hole extends parallel to the vertical axis line of the drive wheel 78. A hollow sleeve 84 is fitted in the through-hole. The hollow sleeve 84 is shorter than the through-hole, and is fitted in a lower portion of the through-hole in such a manner that a projection projecting radially outward from a lower end portion of the sleeve 84 is fixed to the X-axis slide 62 with a bolt 88 as a sort of fixing device. An inner hole of the hollow sleeve 84 and the remaining upper portion of the through-hole cooperate with each other to define the support hole 80.

A sucker-support shaft member 90 is fitted in the hollow sleeve 84 such that the shaft member 90 is rotatable about a vertical axis line, and is movable in an axial direction parallel to the axis line, relative to the X-axis slide 62. The hollow sleeve 84 and a portion of the X-axis slide 62 that supports the sleeve 84 cooperate with each other to provide a movable member 86, and that portion of the X-axis slide 62 provides a main portion of the movable member 86. The remaining portion of the X-axis slide 62; the Y-axis slide 48; a first motion converting device which includes the ball screw 44 and the nut 50 and which converts the rotation of the Y-axis servomotor 54 into the linear movement of the Y-axis slide 48; a second motion converting device which includes the ball screw and nut (not shown) and which converts the rotation of the X-axis servomotor 60 into the linear movement of the X-axis slide 62; the Y-axis servomotor 54, and the X-axis servomotor 60 cooperate with one another to provide an X-Y robot 93 as a sort of moving device which moves the movable member 86. In the present embodiment, the portion of the X-axis slide 62 that supports the hollow sleeve 84, i.e., the shaft member 90 functions as the main portion of the movable member 86.

The X-axis slide 62 has the four support holes 80 which support the four sucker-support shaft members 90, respectively. Thus, the movable member 86 supports the four shaft members 90 at respective positions on a circle whose center is located on the axis line of the drive wheel 78. Since the four shaft members 90 have an identical construction, one of the four members 90 will be described as a representative thereof. The sucker-support shaft member 90 has a sucker-support hole 92 which is concentric with the shaft member 90, which extends in the axial direction of the same 90, and which opens in a lower end of the same 90. An EC sucker 94 as a sort of component holder is fitted in the sucker-support hole 92. The EC sucker 94 sucks and holds an EC 96 by applying vacuum (i.e., negative pressure) to the same 96. Since the support hole 80 extends vertically, the shaft member 90 and the EC sucker 94 also extend vertically. The EC sucker 94 includes a nozzle holder 98 and a suction nozzle 100 which is held by the nozzle holder 98. The nozzle holder 98 is fitted in the sucker-support hole 92 such that the holder 98 is slideable relative to the shaft member 90 in the axial direction of the same 90. The EC sucker 94 additionally includes a compression coil spring 102 as a spring member and as an elastic member as a sort of biasing device. The coil spring 102 is provided between the nozzle holder 98 and the sucker-support shaft member 90 (i.e., the bottom surface of the sucker-support hole 92), and biases the suction nozzle 100 in a direction in which the nozzle 100 projects downward from the shaft member 90. A light emitting plate 104 is formed integrally with the nozzle holder 98. A layer formed of a luminescent material is provided on a lower surface of the light emitting plate 104. The luminescent layer absorbs an ultraviolet light and emits a visible light. The sucker-support shaft member 90 can be said as a nozzle-support shaft member. Since the support holes 80 extend parallel to the axis line of rotation of the drive wheel 78, the EC suckers 94 supported by the support shafts 90 supported by the support holes 80 are rotatable about respective axis lines which are parallel to the axis line of rotation of the drive wheel 78.

An engagement pin 106 is fitted in the nozzle holder 98, diametrically of the holder 98, such that one of opposite end portions of the pin 106 projects radially outwardly of the holder 98. That one end portion of the pin 106 provides an engagement projection as a sort of engagement portion. The engagement projection of the pin 106 is engaged with an elongate hole 108 as an engagement recess as a sort of engagement portion that is formed in an inner circumferential surface of the shaft member 90 that defines the support hole 92. The elongate hole 108 extends parallel to the axial direction of the shaft member 90. More specifically described, the projection of the pin 106 is engaged with the elongate hole 108 such that the pin 106 is movable in a lengthwise direction of the hole 108. Thus, the EC sucker 94 is allowed to be moved relative to the shaft member 90 in the axial direction thereof, while being inhibited from being rotated relative to the same 90. The EC sucker 94 is supported by the movable member 86 via the shaft member 90, such that the sucker 94 is rotatable about its axis line, together with the shaft member 90. A limit of movement of the EC sucker 94 due to the biasing action of the coil spring 102, that is, a limit of projection of the sucker 94 from the shaft member 90 is defined by butting of the projection of the pin 106 against a lower end of the elongate hole 108. Thus, the engagement pin 106 and the elongate hole 108 cooperate with each other to provide not only a relative-rotation inhibiting device which inhibits the EC sucker 94 from being rotated relative to the shaft member 90, but also a projection-limit defining device which defines the limit of projection of the EC sucker 94 from the shaft member 90. The relative-rotation inhibiting device also functions as a rotation transmitting device which transmits the rotation of the shaft member 90 to the EC sucker 94. The EC sucker 94 may be provided with an engagement recess, and the shaft member 90 may be provided with an engagement projection. An inner hole of the suction nozzle 100 provides a vacuum-supply hole 110, which is communicated with the sucker-support hole 92 via an inner passage 112 of the nozzle holder 98. A ring member 114 is externally fitted on a portion of the shaft member 90 that defines the elongate hole 108, so that the ring member 114 externally closes the hole 108.

In this way, the X-axis slide 62 supports four EC suckers 94, i.e., two pairs of EC suckers 94 which are respectively supported by two pairs of sucker-support shaft members 90 which are respectively supported by the previously-described two pairs of support holes 80 shown in FIG. 6. The two pairs of EC suckers 94 are distant by 90 degrees from each other about the axis line 0 of rotation of the drive wheel 78.

A closing member 120 is fitted in, and fixed to, an upper end portion of the support hole 80, via a sealing member 121. Thus, the closing member 120 closes an upper opening of the support hole 80. The hollow sleeve 84 is fitted in a lower portion of the through-hole, and a cylinder bore 122 is defined by an upper portion of the through-hole that is between the closing member 120 and an upper end surface of the sleeve 84. A cylindrical piston 124 is fitted in the cylinder bore 122 such that the piston 124 is movable in the axial direction of the sucker-support shaft member 90. The piston 124 and the cylinder bore 122 cooperate with each other to provide an air-operated cylinder device (hereinafter, referred to as the "air cylinder") 125. The cylindrical piston 124 is produced separately from the shaft member 90, and subsequently is fitted on a projection 126 which projects from an upper end of the shaft member 90. The piston 124 has an internally threaded portion 128 which is screwed with an externally threaded portion 130 of the projection 126. Thus, the piston 124 is fixed to the shaft member 90. The two threaded portions 128, 130 cooperate with each other to provide a fixing device which fixes the piston 124 to the shaft member 90. Thus, the piston 124 which is manufactured as a product separate from the shaft 90 is attached to the shaft member 90 such that the piston 124 is not rotatable, or movable in the axial direction of the shaft member 90, relative to the same 90. Thus, the piston 124 is rotated and moved with the shaft member 90. The piston 124 is provided with no sealing member. Since, however, substantially no space is left between an outer circumferential surface of the piston 124 and an inner circumferential surface of the cylinder bore 122, the piston 124 is substantially airtightly fitted in the bore 122. Thus, the air cylinder 125 is free from the problem of air leakage.

Two air chambers 134, 136 are defined on both sides of the piston 124, respectively, which is fitted in the cylinder bore 122. The X-axis slide 62 has two air supply-and-relieve passage 138, 140 which are communicated with the two air chambers 134, 136, respectively, and each of which is communicated with a solenoid-operated direction control valve 142 (FIG. 4). When the direction control valve 142 is switched, the two air chambers 134, 136 are communicated with the atmosphere and a pressurized-air supply source 144, respectively, or vice versa. When the pressurized air is supplied from the supply source 144 to the second air chamber 136, the piston 124 is moved upward and accordingly the shaft member 90 is moved upward. When the pressurized air is supplied to the first air chamber 134, the piston 124 and the shaft member 90 are moved downward. The entire stroke of upward and downward movement of the shaft member 90 is larger than a distance between a lower end of the suction nozzle 100 of the EC sucker 94 when the shaft member 90 is positioned at an upper stroke end thereof, and the upper surface of the PCB 14 on which the ECs 96 are to be mounted or the respective upper surfaces of the ECs 96 being fed on each of the EC supplying units 30. Four solenoid valves 142 are provided for the four shaft members 90, respectively. Thus, the four shaft members 90 may be moved up and down independent of one another.

A lower stroke end of the shaft member 90 is defined as a height position where the piston 124 butts against the sleeve 84, and an upper stroke end of the same 90 is defined as a height position where the shaft 90 butts against a stopper 150 which is supported by the closing member 120. The closing member 120 has a receiving hole 152 which opens in an upper surface thereof, and a displaceable member 154 which provides the stopper 150 is fitted in the hole 152 such that the displaceable member 154 is concentric with the shaft member 90 and is displaceable in the axial direction of the same 90 relative to the movable member 86. The displaceable member 154 includes a projection 156 which is concentric therewith and projects through the bottom wall of the hole 152 so as to be exposed in the first air chamber 134. The projection 156 has a semi-spherical free end, and contacts the shaft member 90 at a single point on the axis line of the same 90. Since the piston 124 butts on the upper surface of the sleeve 84, the shaft member 90 is prevented from coming out of the support hole 80.

The displaceable member 154 has a receiving hole which opens in an upper surface thereof and in which a cushion member 160 is fitted. A plug 162 which is screwed with the upper opening of the receiving hole 152 presses the cushion member 160 against the displaceable member 154. Thus, it can be said that the cushion member 160 is provided between the displaceable member 154 and the movable member 86. The displaceable member 154 cooperates with the cushion member 160 to provide the stopper 150. The cushion member 160 is formed of a vibration damping rubber, and absorbs impact of the displaceable member 154 and damps vibration of the same 154. The vibration damping rubber has excellent impact and vibration absorbing characteristics, and effectively absorbs the energy of an external force exerted thereto, without producing any rebound to the force. The vibration damping rubber may be the product name, 'Hanenite', available from Naigai Kabushiki Kaisha, Japan. This rubber has physical properties and a life expectancy that are comparable to common rubbers, and exhibits an excellent vibration damping effect at room temperatures (5 to 35° C.), and a less than 10% impact resilience. In addition, this rubber can be molded like common rubbers.

A lower stroke end of the shaft member 90 is detected by a proximity switch 166 as a sort of stroke-end detector. The proximity switch 166 includes a pair of detectable portions 168, 169 which are integral with the shaft member 90, and a detecting head 170 as a sensor which is provided in the X-axis slide 62 and which detects the detectable portions 168, 169. The shaft member 90 has an annular recess 172, and the two detectable portions 168, 169 are provided on both sides of, and adjacent to, the annular recess 172.

The upper stroke end of the shaft member 90 is detected by a photoelectric sensor 176 shown in FIG. 7. The sensor 176 is of a transmission type, and includes a light emitter 178 and a light receiver 180. The sensor 176 is supported by the X-axis slide 62. In the state in which the shaft member 90 is positioned at the lower stroke end thereof, the light receiver 180 cannot receive the light emitted from the light emitter 178 because the ring member 114 interrupts the light. On the other hand, in the state in which the shaft member 90 is contacted with the stopper 150, i.e., is positioned at the upper stroke end thereof, the light receiver 180 can receive the light from the light emitter 178 because the ring member 114 does not interrupt the light. When the light receiver 180 receives a light amount more than a predetermined value, the receiver 180 generates a detection signal to a control device 200 shown in FIG. 10. The predetermined value is slightly greater than half the entire light amount emitted from the light emitter 178. The ring member 114 provides a detectable portion, and cooperates with the photoelectric sensor 176 to provide a stroke-end detector which detects the upper stroke end of the shaft member 90.

The two ring members 114 corresponding to each pair of sucker-support shaft members 90 overlap one another in the Y-axis direction, but respective lower end portions 182 of the two shaft members 90 do not overlap at all in the same direction. The photoelectric sensor 176 is provided as shown in FIG. 7 such that the light emitter and receiver 178, 180 are opposed to each other in the X-axis direction and such that the light emitted from the emitter 178 toward the receiver 180 is interrupted by the overlapping portions of the respective ring members 114 of each pair of shaft members 90, or passes through a small space between the respective lower end portions 182 of each pair of shaft members 90, depending upon the current height position of the shaft members 90.

More specifically described, in the state in which all the four shaft members 90 are positioned at their upper stroke-end positions, the light detector 180 can receive a light amount more than the predetermined value, and supplies the detection signal to the control device 200. On the other hand, if at least one of the four shaft members 90 is moving downward, the corresponding ring member 114 prevents the light receiver 180 from receiving a light amount more than the predetermined value, and accordingly the receiver 180 stops supplying the detection signal to the control device 200. Thus, only in the state in which all the four shaft members 90 are positioned at their upper stroke-end positions, the control device 200 can recognize that each of the four shaft members 90 is positioned at its upper stroke-end position. However, in the present embodiment, the control device 200 does not simultaneously move two or more of the four shaft members 90 and knows which one of the four shaft members 90 is currently moving. Thus, based on whether the light receiver 180 receives a light amount more than the predetermined value, the control device 200 can recognize that the current shaft member 90 has reached its upper stroke-end position, like in the case where four photoelectric sensors 176 would be provided for the four shaft members 90, respectively. Thus, in the present embodiment, the single photoelectric sensor 176 is commonly used for judging whether each of the four shaft members 90 is positioned at its upper stroke-end position.

As shown in FIG. 5, the X-axis slide 62 has an air passage 184 which is communicated with two solenoid-operated direction control valves 186, 187 which are provided on the slide 62. When one or each of the control valves 186, 187 is switched, the air passage 184 is selectively communicated with a vacuum pump 188 as a vacuum device, the pressurized-air supply source 144, or the atmosphere, so that the EC sucker 94 sucks or releases an EC 96. The air passage 184 is communicated with the sucker-support hole 92, the air passage 112, and the vacuum-supply hole 110 via a port 190 formed through the thickness of the sleeve 84, an annular air passage 192 of the sleeve 84, and a plurality of radial air passages 194 formed through the thickness of a portion of the shaft member 90 that defines the sucker-support hole 92. The annular air passage 192 has a length which assures that even if the shaft member 90 is moved up and down, the annular air passage 192 is kept communicated with the radial air passages 194. In addition, even if the shaft member 90 is rotated, the vacuum-supply hole 110 is kept communicated with the air passage 184 via the annular air passage 192. Thus, the air passage 184, the annular air passage 192, the radial air passages 194, and the sucker-support hole 92 cooperate with one another to provide a vacuum-supply passage 196 through which the vacuum-supply hole 100 of the suction nozzle 100 is kept communicated with the air passage 184 even if the shaft member 90 is rotated, or moved in the axial direction thereof, relative to the X-axis slide 62. Four pairs of solenoid valves 186, 187 are provided for the four shaft members 90, respectively, and the four EC suckers 94 can suck or release an EC 96 independent of one another.

The sucker-support shaft member 90 supports a driven wheel 198 which is provided as an integral portion thereof which projects downward from the X-axis slide 62. The driven wheel 198 is meshed with the drive wheel 78. When the drive wheel 78 is rotated by the nozzle-rotating servomotor 70, the driven wheel 198 is rotated and the shaft member 90 and the EC sucker 94 are rotated about their common axis line. The drive wheel 78 is longer than. the driven wheels 198, and the length of the drive wheel 78 assures that even if the driven wheel 198 is moved with the shaft member 90 in the axial direction thereof, the drive wheel 78 is kept meshed with the driven wheel 198. The above-described rotating device 82 cooperates with the drive wheel 78 and the driven wheels 198 to provide a sucker rotating device 199.

Figure 8:
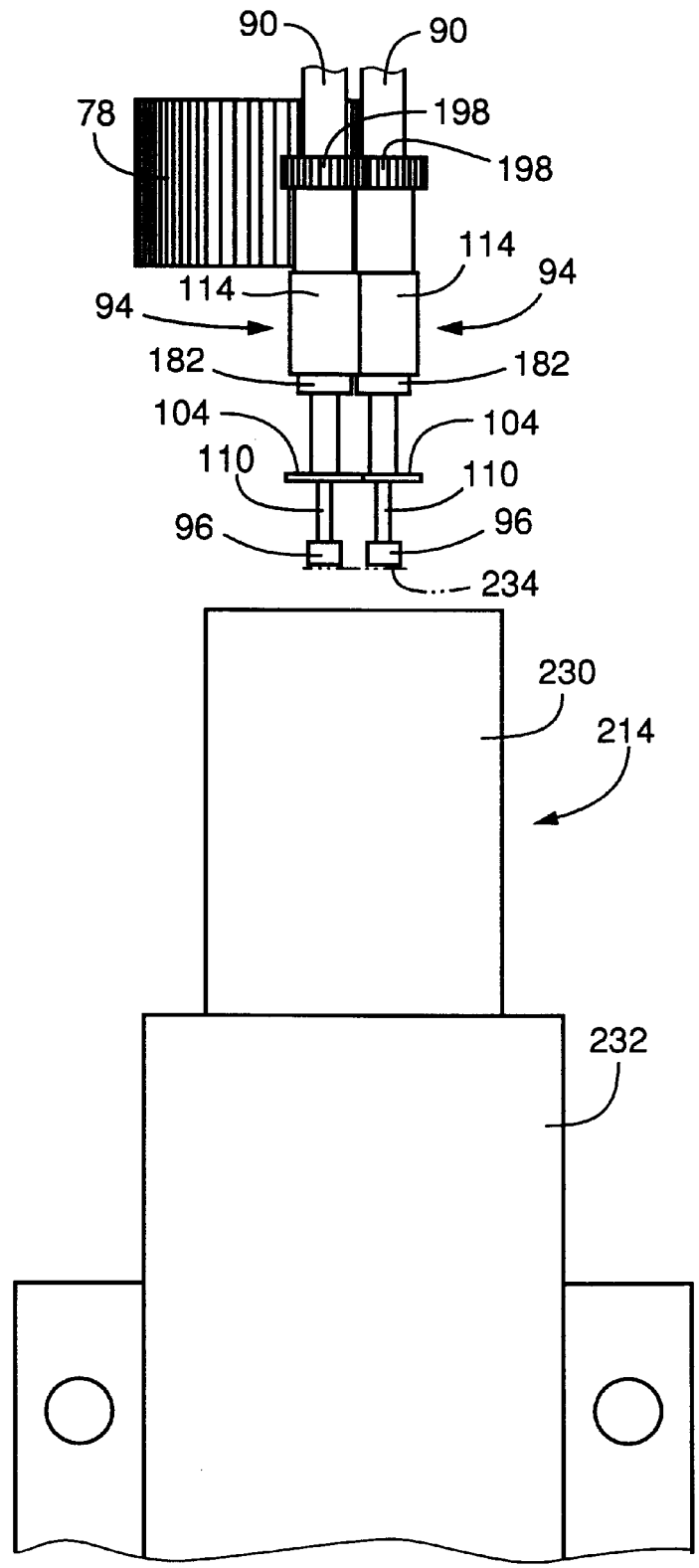
FIG. 8 is a front elevation view of a pair of sucker-support shaft members and an EC-image taking device.

As shown in FIG. 1, an EC-image taking device 214 is provided at a fixed position on the bed 10 between each of the sixteen EC supply-unit groups 20 and a corresponding one of the sixteen EC mounting units 22. Each of the sixteen EC-image taking devices 214 includes a lens 230 and a CCD camera 232 as shown in FIG. 8, and a lighting device (not shown), and simultaneously takes respective images of the two ECs 96 held by the two EC suckers 94 supported by each pair of sucker-support shaft members 90.

Each EC-image taking device 214 faces vertically upward. The lighting device emits an ultraviolet light toward the luminescent plate 104, and the plate 104 absorbs the ultraviolet light and emits a visible light. Thus, the image taking device 214 can take a silhouette image of the EC 96. A range of view 234 of the image taking device 214 is a horizontal square as indicated in two-dot chain lines in FIG. 9. One pair of sides of the square range of view 234 are parallel to the X axis and the other pair of sides of the same 234 are parallel to the Y axis. One of two diagonal lines 236, 238 of the range of view 234 is parallel to a straight line passing through respective axis lines of one pair of EC suckers 94, and the other diagonal line of the range of view 234 is parallel to a straight line passing through respective axis lines of the other pair of EC suckers 94. Therefore, the X-axis and Y-axis slides 62, 48 can be moved such that the respective axis lines of the EC suckers 94 of the one pair perpendicularly intersect the one diagonal line 236 of the square range of view 234 of the image taking device 214, at respective positions which are axis-symmetric with each other with respect to an optical axis, Q, of the image taking device 214, so that the image taking device 214 simultaneously takes the respective images of the ECs held by the one pair of EC suckers 94, and such that the respective axis lines of the EC suckers 94 of the other pair perpendicularly intersect the other diagonal line 238 of the square range of view 234, at respective positions which are axis-symmetric with each other with respect to the optical axis Q of the image taking device 214, so that the image taking device 214 simultaneously takes the respective images of the ECs held by the other pair of EC suckers 94. The sucker-support shaft members 90 extend vertically, and the respective vertical axis lines of the shaft members 90 perpendicularly intersect the diagonals 236, 238 of the horizontal square range of view 234 of the image taking device 214.

The angle θ shown in FIG. 6 is determined such that in the state in which each pair of EC suckers 94 are positioned relative to the image taking device 214 as described above, the respective luminescent plates 104 of the two EC suckers 94 do not interfere with each other, the respective ECs 96 held by the two EC suckers 94 fall within respective ranges of the corresponding luminescent plates 104 and simultaneously fall within the range of view 234, and respective images of the two ECs 96 are taken which have as large as possible dimensions. In addition, the angle θ is determined by taking, into account, possible positional errors of the ECs 96 relative to the corresponding EC suckers 94. In the state in which each pair of EC suckers 94 are provided at the thus determined angular positions ±θ, the respective ring members 114 of the two EC suckers 94 partially overlap each other in the Y-axis direction, but the respective lower end portions 182 of the two EC suckers 94 do not overlap each other in the Y-axis direction. Therefore, the single photoelectric sensor 176 can be commonly used for the four EC suckers 94.

Figure 10:
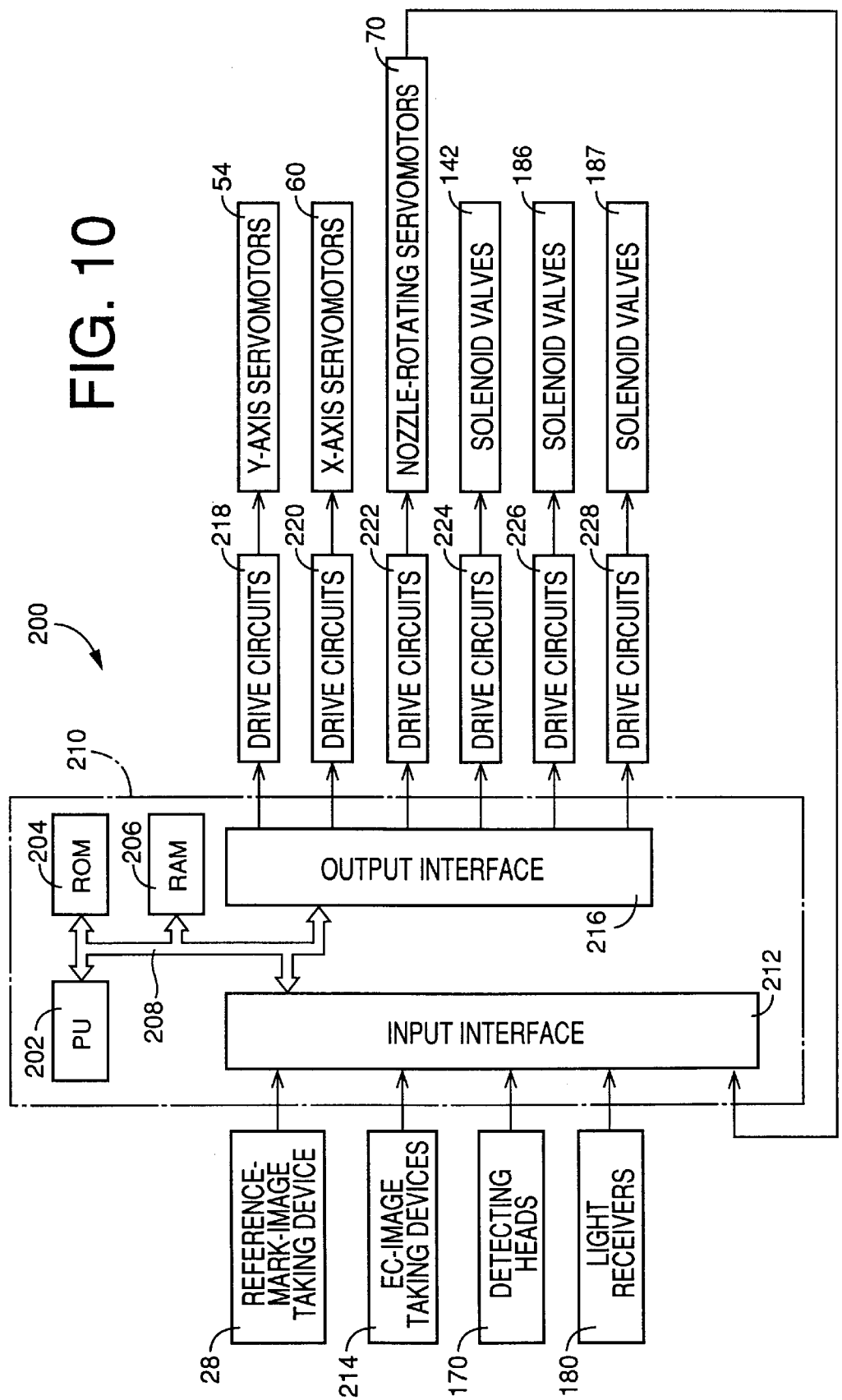
FIG. 10 is a block diagram of a relevant portion of a control device which controls the EC mounting system of FIG. 1.

The present EC mounting system 8 is controlled by the control device 200 shown in FIG. 10. The control device 200 is essentially provided by a computer 210 including a processing unit (PU) 202, a read only memory (ROM) 204, a random access memory (RAM) 206, and bus 208 connecting the elements 202, 204, 206 to one another. An input interface 212 and an output interface 216 are connected to the bus 208. The reference-mark-image taking device 28, the respective detecting heads 170 of the proximity switches 166, the respective light receivers 180 of the photoelectric sensors 176, and the EC-image taking devices 214 are connected to the input interface 212.

The Y-axis servomotors 54, the X-axis servomotors 60, the nozzle-rotating servomotors 70, the solenoid valves 142, 186, 187 are connected to the output interface 216 via respective drive circuits 218, 220, 222, 224, 226, 228. An output signal of an encoder provided for each of the nozzle rotating servomotors 70 is input to the input interface 212, so that the control device 200 controls the each servomotor 70 based on the output signal. Thus, the corresponding rotary shaft 66 is accurately rotated by a desired angle in a desired one of opposite directions. The ROM 204 stores various control programs which are needed for mounting ECs 96 on PCBs 14. Each of the servomotors 54, 60, 70 is a rotary electric motor as a sort of electric motor as a drive source, and can be controlled with respect to its rotation angle or amount. The servomotors 54, 60, 70 may be replaced with stepper motors.

When the ECs 96 are mounted on the PCB 14 by each of the sixteen EC mounting units 22, first, the X-axis slide 62 and the Y-axis slide 48 of the corresponding X-Y robot 93 are moved so that the four EC suckers 94 are sequentially moved to a position or positions above the EC-supply portion or portions of one or more EC supplying units 30 of the corresponding supply-unit group 20, and suck respective ECs 96 from the unit or units 30. When the four EC suckers 94 suck respective ECs 96, the EC suckers 94 or the corresponding shaft members 90 take their reference rotation positions or phases, which correspond to a predetermined value indicated by the output signal of the encoder provided for the nozzle-rotating servomotor 70. Usually, each of the four shaft members 90 takes its upper stroke-end position as indicated in two-dot chain line in FIG. 5. After the each shaft member 90 is moved to a position above the EC-supply portion of one EC supplying unit 30, the shaft member 90 is moved downward. More specifically described, the solenoid-operated direction control valve 142 is switched, and the first air chamber 134 is communicated with the air source 144, and the second air chamber 136 is communicated with the atmosphere. Thus, the piston 124 and the shaft member 90 are moved downward. Consequently the EC sucker 94 is lowered.

Figure 11:
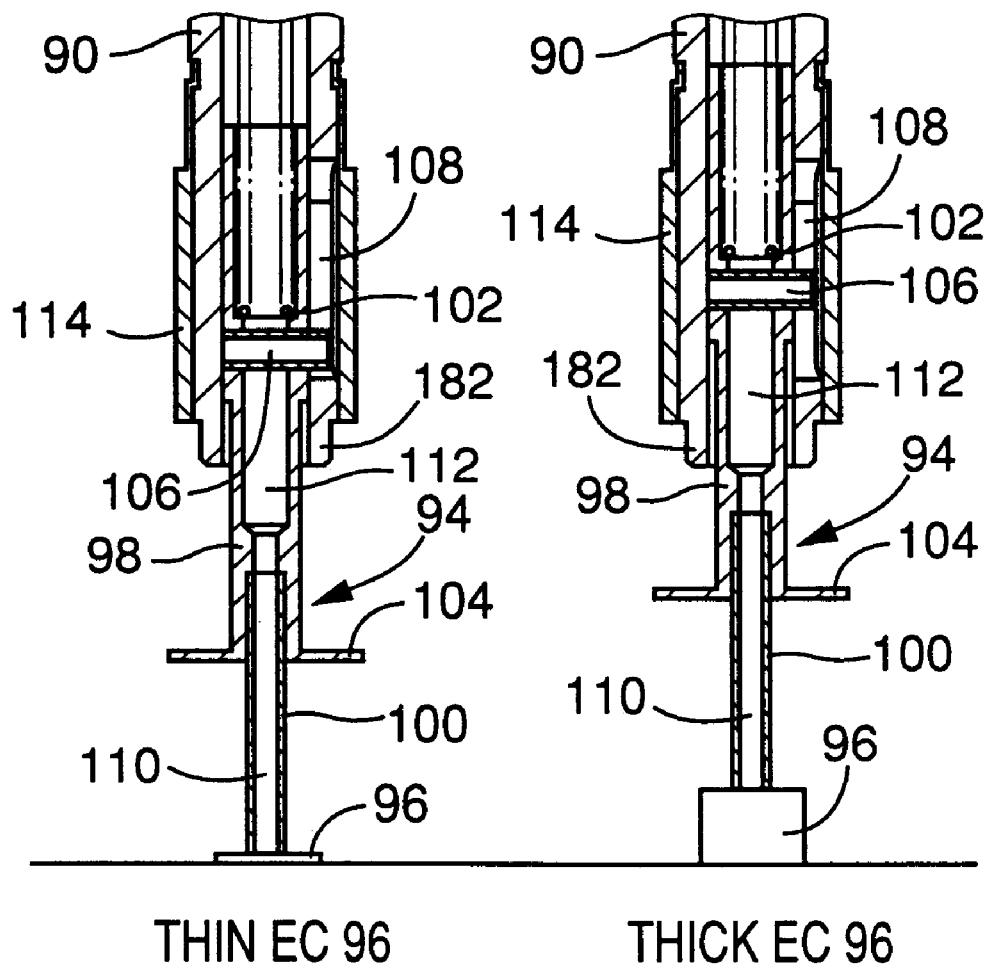
FIG. 11 is a view for explaining the manner in which ECs are sucked and mounted by the EC mounting device of FIG. 1.

As described above, the stroke of upward and downward movement of each of the shaft members 90 is greater than the distance between the lower end of the suction nozzle 100 of the EC sucker 94 when the each shaft member 90 is positioned at its upper stroke-end position, and the respective upper surfaces of the ECs 96 fed on each of the EC supplying units 30. As shown in FIG. 11, the respective height positions of the respective upper surfaces of two different ECs 96 may differ from each other depending upon their thickness values and/or the manufacturing errors of the two EC supplying units 30 which supply the two ECs 96, respectively. In this case, however, the suction nozzle 100 can reliably contact each of the ECs 96. After the suction nozzle 100 contacts the EC 96, the shaft member 90 is further moved downward over a small distance. This excessive downward movement of the shaft member 90 is allowed by the compression of the coil spring 102. That is, the difference between the respective height positions of the respective upper surfaces of different ECs 96, because of different thickness values of the ECs 96 and/or the manufacturing errors of the EC supplying units 30, are accommodated by the compression of the coil spring 102. Thus, the EC sucker 94 can reliably suck each EC 96 without damaging the same 96. Since the compression coil spring 102 is long and its spring constant is low, a small difference in the amount of compression of the spring 102 does not result in a large difference in the biasing force produced thereby. Thus, the suction nozzle 100 applies a substantially equal force to different ECs 96 that may have different thickness values.

That the shaft member 90 has reached its lower stroke-end position is detected by the proximity switch 166. In the state in which the shaft member 90 is positioned at its upper stroke-end position as indicated in two-dot chain line in FIG. 5, the second detectable portion 169 of the shaft member 90 is detected by the detecting head 170, which generates an ON signal to the control device 200. When the downward movement of the shaft member 90 is started, the second detectable portion 169 is not detected by the detecting head 170, which generates an OFF signal to the control device 200. Thus, the control device 200 recognizes that the shaft member 90 is moving downward. When the piston 124 is contacted with the sleeve 84, i.e., is positioned at its lower stroke-end position, the first detectable portion 168 is detected by the detecting head 170, which generates the ON signal to the control device 200. Based on these changes of the ON and OFF signals, the control device 200 recognizes that the shaft member 90 has reaches its lower stroke-end position.

After the downward movement of the shaft member 90 is started and before the suction nozzle 100 contacts the EC 96, the vacuum-supply passage 196 is communicated with the vacuum pump 188 via the solenoid valve 186, so that a vacuum or a negative air pressure is supplied to the vacuum-supply hole 110 of the suction nozzle 100. The nozzle 100 contacts the EC 96 and sucks and holds the same 96 by applying the vacuum thereto. After the nozzle 100 holds the EC 96, the first air chamber 134 is communicated with the atmosphere and the second air chamber 136 is communicated with the air source 144, so that the piston 124 and the shaft member 90 are moved upward and accordingly the EC sucker 94 holding the EC 96 is moved upward. When the control device 200 recognizes that the shaft member 90 has reached its lower stroke-end position, the control device 200 determines a timing at which the upward movement of the shaft member 90 is started. Thus, it is assured that the shaft member 90 is elevated after the EC sucker 94 has sucked and held the EC 96. Since the drive wheel 78 is long in the axial direction of the shaft member 90, the driven wheel 198 is kept meshed with the drive wheel 78 even if the shaft member 90 is moved upward. Thus, the driven wheel 198 is elevated relative to the drive wheel 78, as indicated at two-dot chain line in FIG. 5.

When the shaft member 90 is elevated, eventually, the shaft member 90 butts against the projection 156 of the displaceable member 154, as indicated in two-dot chain line in FIG. 5. From the position where the shaft member 90 butts on the projection 156, the shaft member 90 is further elevated a little more distance while displacing the displaceable member 154 upward and compressing the cushion member 160, and then the shaft member 90 is stopped and kept at its upper stroke-end position. Since the cushion member 160 formed of the vibration damping rubber is fitted in the displaceable member 154, the impact produced when the shaft member 90 butts on the projection 156 is absorbed by the cushion member 160, and the vibration of the displaceable member 154 is damped by the same 160. Thus, the impact and vibration produced when the shaft member 90 is stopped are largely reduced, which contributes to preventing the EC 96 from dropping off the EC sucker 94, or changing its posture relative to the same 94, because of the impact or vibration.

While the shaft member 90 is moved upward toward its upper stroke-end position, the ring member 114 interrupts the light emitted from the light emitter 178 of the photo-electric sensor 176, so that the light receiver 180 cannot receive a light amount more than the predetermined amount. However, once the shaft member 90 reaches its upper stroke-end position, the ring member 114 does not interrupt the light from the light emitter 178, so that the light receiver 180 receives a light amount more than the predetermined amount and generates the detection signal to the control device 200. Thus, the control device 200 recognizes that the shaft member 90 has reached its upper stroke-end position. Based on this recognition, the control device 200 moves the X-axis and/or Y-axis slides 62, 48, so that another EC sucker 94 is moved to a position above the EC-supply portion of an appropriate EC supplying unit 30 and subsequently the corresponding shaft member 90 is moved downward to pick up an EC 96 from the EC supplying unit 30.

Figure 9:
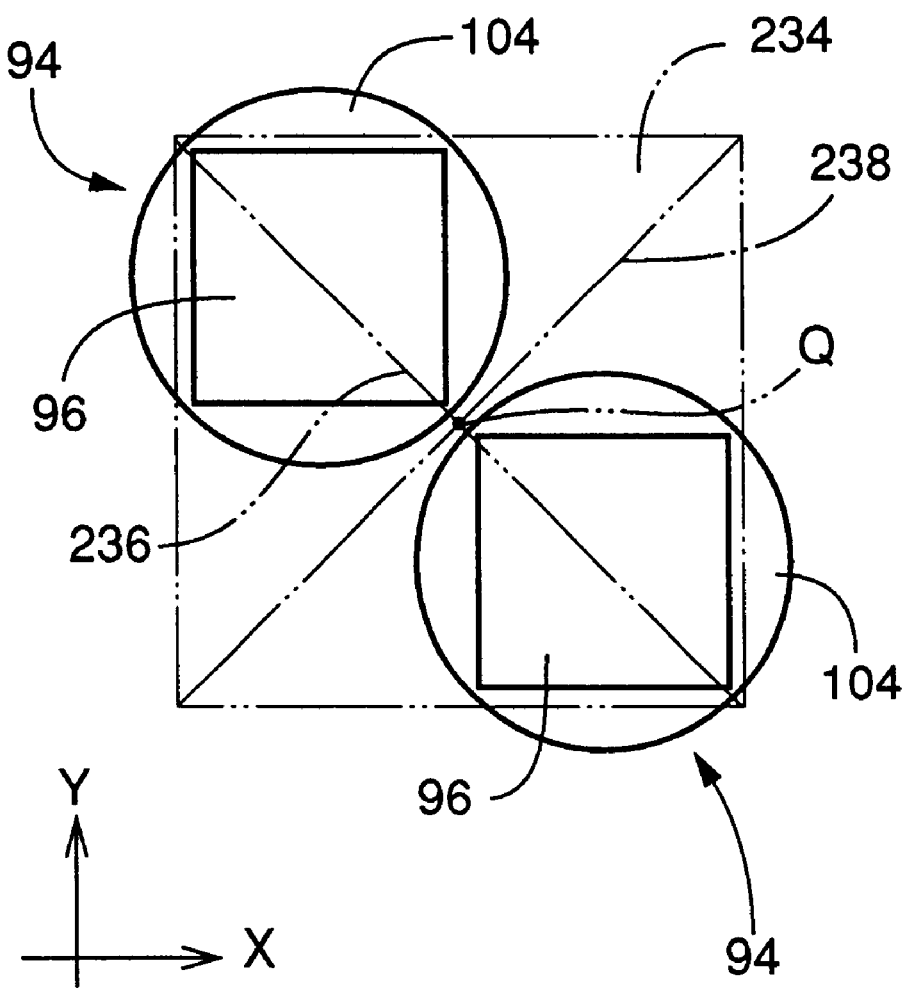
FIG. 9 is a view for explaining a square range of view of the EC-image taking device.

After the two pairs of EC suckers 94 have sucked and held respective ECs 96, one pair of EC suckers 94 are moved to a position above the EC-image taking device 214 and the respective images of the two ECs 96 held by the one pair of EC suckers 94 are simultaneously taken by the image taking device 214. After the respective images of the two ECs 96 held by the one pair of EC suckers 94 are taken by the image taking device 214, the X-axis slide 62 is moved in the X-axis direction so that the other pair of EC suckers 94 are moved to the position above the EC-image taking device 214 and the respective images of the two ECs 96 held by the other pair of EC suckers 94 are simultaneously taken by the image taking device 214. More specifically described, the control device 200 controls the X-axis and Y-axis servomotors 60, 54 to move and stop the movable member 86 such that the respective axis lines of the EC suckers 94 of one pair perpendicularly intersect one diagonal line 236 of the square range of view 234 of the image taking device 214, at respective positions which are axis-symmetric with each other with respect to the optical axis Q of the image taking device 214 (i.e., the center of the square range of view 234), so that the two ECs 96 fall within the range of view 234, as shown in FIG. 9, and the image taking device 214 simultaneously takes the respective images of the ECs held by the one pair of EC suckers 94, and subsequently controls the X-axis servomotor 60 to move and stop the movable member 86 in the X-axis direction such that the respective axis lines of the EC suckers 94 of the other pair perpendicularly intersect the other diagonal line 238 of the square range of view 234, at respective positions which are axis-symmetric with each other with respect to the optical axis Q of the image taking device 214, so that the two ECs 96 fall within the range of view 234 and the image taking device 214 simultaneously take the respective images of the ECs held by the other pair of EC suckers 94.

Based on a batch of image data representative of the taken image of each of the four ECs 96, the control device 200 or the computer 210 calculates a positional error of the center of each EC 96 from its reference position in each of the X-axis and Y-axis directions, and an angular error of each EC 96 from its reference angular position about the axis line of the shaft member 96, and stores the calculated errors in the RAM 206.

After the respective images of the four ECs 96 are taken by the EC-image taking device 214, the X-axis and Y-axis slides 62, 48 are moved so that the four shaft members 90 are sequentially moved to respective positions above prescribed EC-mount places on the PCB 14 where the EC four suckers 94 mount the respective ECs 96 on the PCB 14. During this movement of the slides 62, 48, the angular error of each of the ECs 96 is corrected and, in addition, the current angular position of each EC 94 may be changed to an angular position prescribed by the control program stored in the ROM 204. That is, some ECs 96 are mounted on the PCB 14, at their prescribed angular positions different from respective angular positions taken thereby at the time when they are supplied from the EC supplying unit 30 or device 21. The difference between the angular position of each EC 96 at the time when the each EC 96 is supplied without any angular error from the EC supplying device 21 and the prescribed angular position at which the each EC 96 is mounted on the PCB 14 is determined in advance based on the sort of the each EC 96, the place where the each EC 96 is mounted on the PCB 14, and other factors, and is prescribed by the control program stored in the ROM 204.

The correcting of the angular error of each EC 96 and the changing of the current angular position of the each EC 96 to the prescribed angular position at which the each EC 96 is to be mounted on the PCB 14, are carried out by rotating the drive wheel 78 and thereby rotating the corresponding driven wheel 198 and sucker-support shaft member 90. The shaft member 90 is rotated in the state in which the shaft member 90 is positioned at its upper stroke-end position and is held in contact with the projection 156 of the corresponding stopper 150. Since the projection 156 the integral portion of the displaceable member 154 and has the hemi-spherical free end portion, the shaft member 90 contacts, at a single point, the projection 156. Therefore, when the shaft member 90 is rotated, it is subjected to a small resistance only. Thus, the shaft member 90 is smoothly rotated, and the wearing of the shaft member 90 and the stopper 150 is largely reduced.

The correcting of the respective possible angular errors of all the ECs 96 and the possible changing of their current angular positions to their prescribed angular positions may be carried out by rotating the sucker-support shaft members 90 or EC suckers 94 in a predetermined, single direction only for all the ECs 96. In the present embodiment, however, the control device 200 selects, for each of the ECs 96, one of opposite rotation directions of the corresponding shaft member 90, such that the absolute value of the rotation angle or amount needed for the shaft member 90 to reach the prescribed angular position when the shaft member 90 is rotated in the selected one direction, is smaller than that when the shaft member 90 is rotated in the other direction. In a particular case, before an EC 96 that is to be first mounted on a PCB 14 reaches a position above its prescribed EC-mount place on the PCB 14, the correcting of a possible angular error of the EC 96 and a possible changing of its current angular position to its prescribed angular position may not be finished. In this case, the shaft member 90 carrying the EC 96 is rotated after the shaft member 90 or the EC 96 reaches the position above the prescribed EC-mount place.

In addition, the control device 200 corrects the positional errors of each of the prescribed EC-mount places on the PCB 14 in the X-axis and Y-axis directions, and the positional errors of the center of the corresponding EC 96 in the X-axis and Y-axis directions, by modifying the prescribed distances of movement of the X-axis slide 62 and the Y-axis slide 48 that are needed for the corresponding sucker-support shaft member 90 to carry the corresponding EC 96 to the each prescribed EC-mount place on the PCB 14. More specifically described, before an EC mounting operation is started, the reference-mark-image taking device 28 takes respective images of the reference marks affixed to each PCB 14, and the control device 200 calculates, based on the taken images, the positional errors of each of the prescribed EC-mount places on the PCB 14 in the X-axis and Y-axis directions. The positional errors of the center of each of the ECs 96 in the X-axis and Y-axis directions are the sum of the positional errors of the center of the each EC 96 in the X-axis and Y-axis directions that are produced when the each EC 96 is sucked and held by one EC sucker 94, and the positional changes of the center of the each EC 96 in the X-axis and Y-axis directions that are produced when the one EC sucker 94 is rotated for correcting the angular error of the each EC 96 and changing the current angular position of the each EC 96 to its prescribed angular position.

Since the prescribed distances of movement of the X-axis slide 62 and the Y-axis slide 48 are thus modified, the EC 96 that is to be first mounted on the PCB 14 is moved with accuracy to the position above its prescribed EC-mount place on the PCB 14. Subsequently, the sucker-support shaft member 90 carrying the EC 96 is moved downward so that the EC sucker 94 is moved downward. As described previously, the entire stroke of upward and downward movement of the shaft member 90 is greater than the distance between the lower end of the suction nozzle 100 of the shaft member 90 being positioned at its upper stroke-end position and the upper surface of the PCB 14 on which the EC 96 is mounted. Thus, the EC 96 can reliably be mounted on the PCB 14, irrespective of the thickness (or height) of the EC 96 and/or the manufacturing errors of the PCB supporting and conveying device 12. After the EC 96 reaches the PCB 14, the shaft member 90 is further moved downward by a small distance, while this downward movement is allowed by the compression of the coil spring 102. After the EC 96 contacts the PCB 14, the vacuum-supply hole 110 is communicated with the air source 144 so that the EC 96 is quickly released from the EC sucker 94 and is placed on the PCB 14. In the state in which the vacuum-supply hole 110 is communicated with the vacuum pump 188, the direction control valve 187 is switched to its position where the valve 187 communicates the hole 110 with the air source 144. Therefore, immediately after the direction control valve 186 disconnects the hole 110 from the vacuum pump 188, the pressurized air from the air source 144 reaches the hole 110. After the air is supplied to the hole 110 and accordingly the EC 96 is released from the nozzle 100, the direction control valve 187 is so switched as to connect the hole 110 to the atmosphere.

After the EC 96 is mounted on the PCB 14, the sucker-support shaft member 90 is moved upward to its upper stroke-end position, and the X-axis slide 62 and the Y-axis slide 48 are moved so that the second EC 96 is mounted on the PCB 14. For the second EC 96, too, the control device 200 rotates the drive wheel 78 and accordingly the shaft member 90 carrying the second EC 96, for correcting the angular error of the second EC 96 and changing the current angular position of the second EC 96 to its prescribed angular position, and additionally corrects the respective movement amounts of the X-axis and Y-axis slides 62, 48 in the X-axis and Y-axis directions. Since the drive wheel 78 is meshed with the respective driven wheels 198 of all the shaft members 90, the shaft members 90 other than the shaft member 90 carrying the second EC 96 are rotated simultaneously with the rotation of the shaft member 90 carrying the second EC 96. Therefore, for the shaft member 90 carrying the first EC 96, the control device 200 determines a rotation angle (or amount) and a rotation direction of the shaft member 90, based on only the angular error of the first EC 96 and the prescribed angular position of the same 96. However, for each of the shaft members 90 carrying the second and subsequent ECs 96, the control device 200 determines a rotation angle (or amount) and a rotation direction of the each shaft member 90, based on not only the angular error of the corresponding one of the second and subsequent ECs 96 and the prescribed angular position of the one EC 96 but also the rotation angle or angles and rotation direction or directions determined for the shaft member or members 90 which precedes or precede the each shaft member 90. For each of the the second and subsequent ECs 96, too, the control device 200 determines one of opposite rotation directions of the shaft member 90 carrying the each EC 96, such that the absolute value of the rotation angle needed for the shaft member 90 to reach the prescribed angular position when the shaft member 90 is rotated in the selected one direction, is smaller than that when the shaft member 90 is rotated in the other direction.

After all the four ECs 96 are mounted on the PCB 14, the four sucker-support shaft members 90 are moved to the supply-unit group 20, and the four EC suckers 94 take respective next ECs 96 from the EC supplying units 30 of the unit group 20. The shaft members 90 are returned to respective reference angular positions, before the EC suckers 94 take the next ECs 96 from the units 30. However, the control device 200 may be adapted to control the shaft members 90 in such a manner that the EC suckers 94 take the next ECs 96 from the units 30, in the state in which the shaft members 90 are kept at respective angular positions at which the shaft members 90 have mounted the preceding ECs 96 on the PCB 14.

Figure 12:
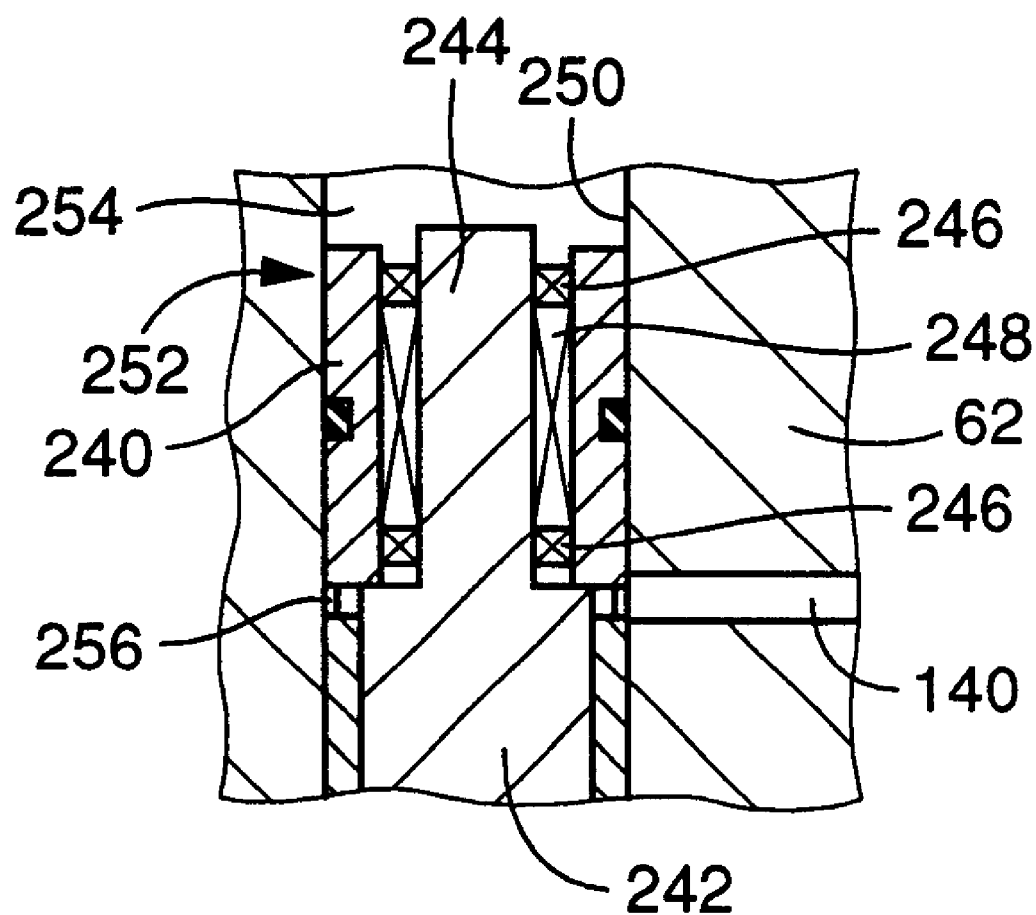
FIG. 12 is a cross-sectioned, front elevation view of a sucker-support shaft member and an air cylinder of an EC mounting unit of an EC mounting device of another EC mounting system as a second embodiment of the present invention.

In the illustrated embodiment, each sucker-support shaft member 90 is associated with the piston 124 fixed thereto. However, FIG. 12 shows a piston 240 which is rotatable relative to a sucker-support shaft member 242. The piston 240 is airtightly fitted via sealing members 246 and a bearing 248 on a projection 244 projecting from an upper end of the shaft member 242, such that the piston 240 is rotatable relative to the shaft member 242 and is not movable relative to the same 242 in an axial direction of the same 242. The piston 240 is fitted in a cylinder bore 250 such that the piston 240 is movable relative to the bore 250 in the axial direction of the shaft member 242. The piston 240 and the cylinder bore 250 cooperate with each other to provide an air cylinder 252.

Two air chambers 254, 256 are provided on both sides of the piston 240 in the axial direction of the shaft member 242. When a pressurized or compressed air is supplied to the lower air chamber 256, the piston 240 and accordingly the shaft member 242 are moved upward; and when the compressed air is supplied to the upper air chamber 254, the piston 240 and accordingly the shaft member 242 are moved downward. Even if the shaft member 242 is rotated, the piston 240 is not rotated. That is, the shaft member 242 is rotated relative to the piston 240.

Figure 13:
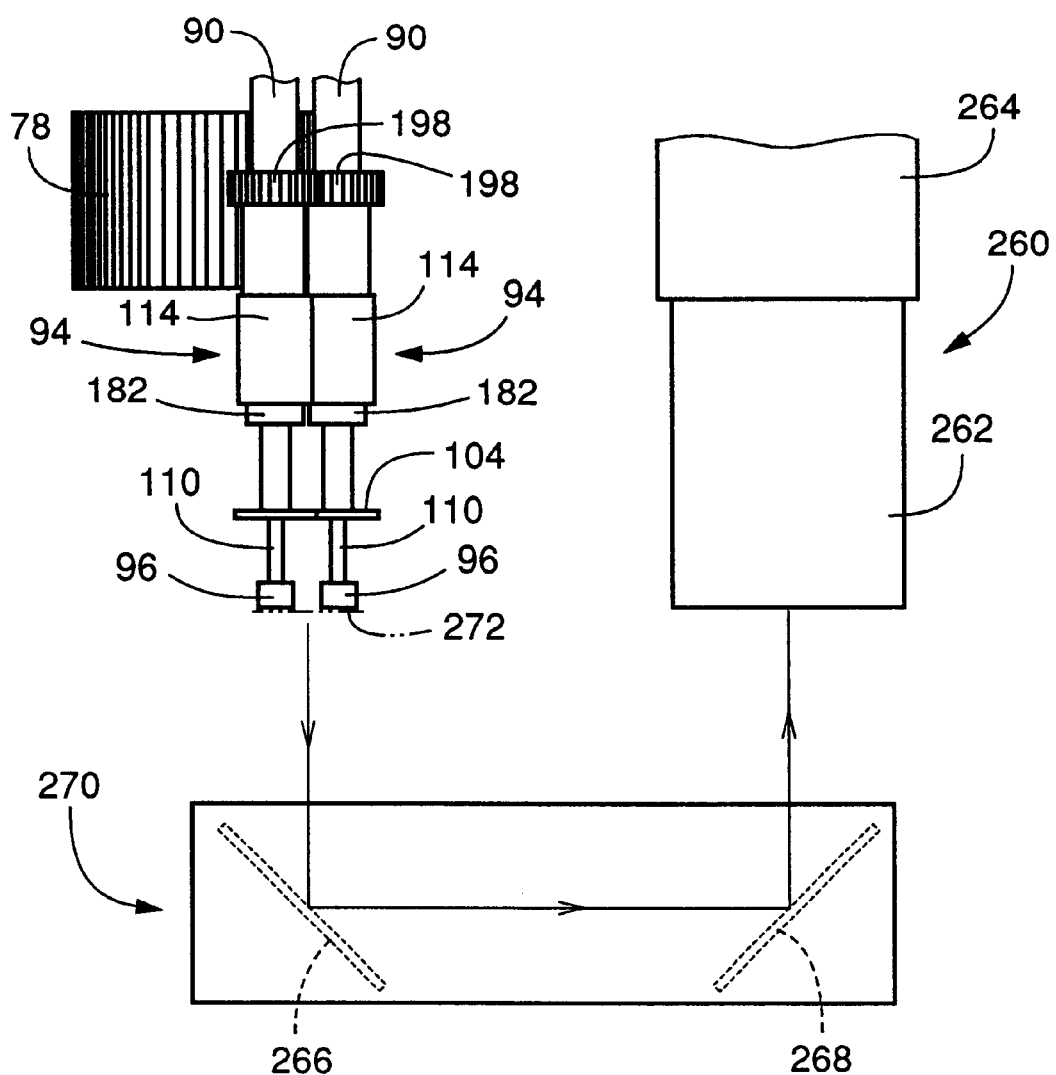
FIG. 13 is a front elevation view of a pair of sucker-support shaft members and an EC-image taking device of another EC mounting system as a third embodiment of the present invention.

In each of the illustrated embodiments, the EC-image taking devices 214 faces in a vertically upward direction. However, each EC-image taking device may face in a different direction. For example, FIG. 13 shows an EC-image taking device 260 which faces a vertically downward direction. The image taking device 260 includes a lens 262 and a CCD camera 264 which face vertically downward. A reflecting device 270 which includes two reflecting plates 266, 268 is provided at a position opposed to each pair of EC suckers 94 being positioned at an EC-image-take position. Respective silhouette images of two ECs held by each pair of EC suckers 94 are reflected by the two reflecting plates 266, 268, by 180degrees, so that those images are incident to the lens 262. In this embodiment, too, a range of view 272 of the CCD camera 264 is a horizontal square, and one pair of sides of the square range of view 272 are parallel to an X-axis direction and the other pair of sides of the square range of view 272 are parallel to a Y-axis direction perpendicular to the X-axis direction. A lighting device (not shown) is provided between the reflecting device 270 and each pair of EC suckers 94 being positioned at the EC-image-take position. The lighting device emits light around the EC suckers 94.

When an EC-image taking operation is carried out, each pair of EC suckers 94 are moved to the EC-image-take position above the first reflecting plate 266 of the reflecting device 270. In the present embodiment, too, a movable member 86 is moved such that respective axis lines of the EC suckers 94 of each pair perpendicularly intersect a corresponding one of two diagonal line of the square range of view 272 of the image taking device 260, at respective positions which are axis-symmetric with each other with respect to an optical axis of the image taking device 214 (i.e., the center of the range of view 272), so that the two ECs 96 fall within the range of view 272 and the image taking device 260 simultaneously takes the respective images of the ECs 96 held by each pair of EC suckers 94.

Figure 14:
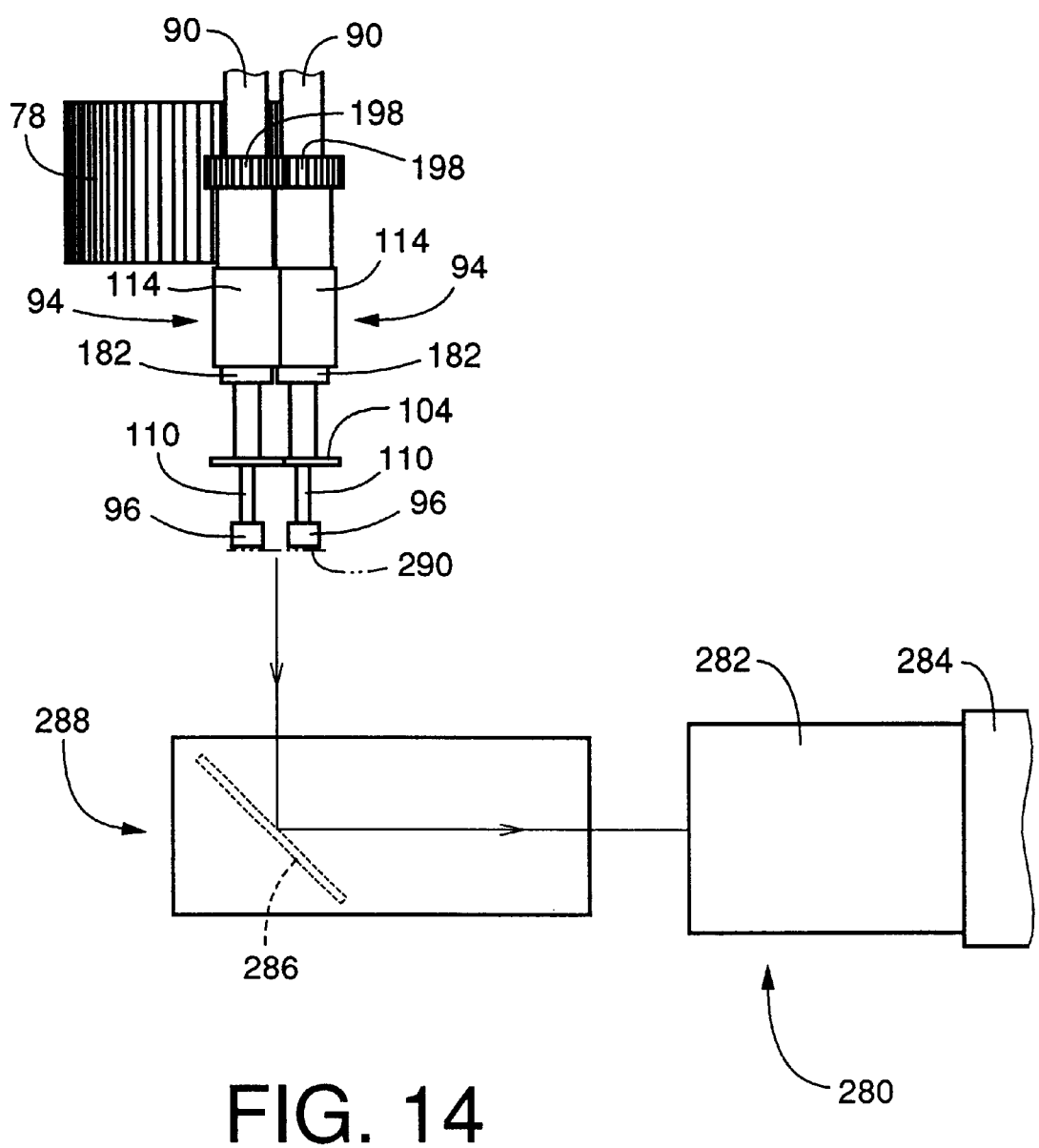
FIG. 14 is a front elevation view of a pair of sucker-support shaft members and an EC-image taking device of another EC mounting system as a fourth embodiment of the present invention.

In addition, FIG. 14 shows an EC-image taking device 280 which faces in a direction perpendicular to the respective axis lines of the EC suckers 94, e.g., in a horizontal direction. The image taking device 280 includes a lens 282 and a CCD camera 284 which face in a horizontal direction. A reflecting device 288 which includes a reflecting plate 286 is provided at a position opposed to each pair of EC suckers 94 being positioned at an EC-image-take position. Respective silhouette images of two ECs 96 held by each pair of EC suckers 94 are reflected by the reflecting plate 286, by 90 degrees, so that those images are incident to the lens 282. In this embodiment, too, a range of view 290 of the CCD camera 284 is a horizontal square, and one pair of sides of the square range of view 290 are parallel to an X-axis direction and the other pair of sides of the square range of view 290 are parallel to a Y-axis direction perpendicular to the X-axis direction. A lighting device (not shown) is provided between the reflecting device 288 and each pair of EC suckers 94 being positioned at the EC-image-take position. The lighting device emits light around the EC suckers 94. When an EC-image taking operation is carried out, each pair of EC suckers 94 are moved to the EC-image-take position above the reflecting plate 286 of the reflecting device 288. In the present embodiment, too, a movable member 86 is moved and stopped such that respective axis lines of the EC suckers 94 of each pair perpendicularly intersect a corresponding one of two diagonal line of the square range of view 290 of the image taking device 280, at respective positions which are axis-symmetric with each other with respect to an optical axis of the image taking device 280 (i.e., the center of the range of view 290), so that the two ECs 96 fall within the range of view 290 and the image taking device 280 simultaneously takes the respective images of the ECs 96 held by each pair of EC suckers 94.

In each of the illustrated embodiments, each of the EC-image taking devices 214, 260, 280 includes the lighting device. However, the lighting device of each image taking device 214, 260, 280 may be replaced with a lighting device which is provided on each EC sucker 94, each sucker-support shaft member 90, or the movable member 86.

In each of the illustrated embodiments, each of the EC-image taking devices 214, 260, 280 takes the silhouette image of each EC 96. However, each image taking device 214, 260, 280 may take an image of an exposed surface of each EC 96. In this case, a surface of the EC 96 is exposed to the light emitted by the lighting device, and the image taking device 214, 260, 280 takes an image of the exposed surface of the EC 96 based on the light reflected from the exposed surface.

In each of the illustrated embodiments, two of the four sucker-support shaft members 90, 242 have a first position in the Y-axis direction and the other two shaft members 90, 242 have a second position different from the first position in the Y-axis direction, and all the four shaft members 90, 242 have respective different positions in the X-axis direction and are arranged along the X axis. However, it is possible that two of the four shaft members 90, 242 have a first position in the X-axis direction and the other two shaft members 90, 242 have a second position different from the first position in the X-axis direction, and that all the four shaft members 90, 242 have respective different positions in the Y-axis direction and are arranged along the Y axis.

In each of the illustrated embodiments, each of the EC mounting units 22 has the two pairs of sucker-support shaft members 90, 242 which are spaced from each other by 90 degrees about the axis line 0 of the drive wheel 78. However, each EC mounting unit 22 may have three or four pairs of shaft members 90, 242 which are spaced from one another by 90 degrees about the axis line O of the drive wheel 78.

In each of the illustrated embodiments, each of the sucker-support shaft members 90, 242 is moved up and down at a timing different from that at which the X-axis and Y-axis slides 62, 48 are moved. However, the time duration in which the each shaft member 90, 242 is moved up and down may overlap the time duration in which the X-axis and Y-axis slides 62, 48 are moved.

The sucker-support shaft members 90, 242 may be adapted such that the shaft members can be moved up and down not only by the air cylinders 125, 252 but also by a Z-axis slide which is provided on the X-axis slide such that the Z-axis slide is movable in a Z-axis direction (e.g., a vertical direction) perpendicular to the X-axis and Y-axis directions. In this case, the shaft members 90, 242 are supported by the Z-axis slide, in the same manner in which the shaft members 90, 242 are supported by the X-axis slide 62 in each of the illustrated embodiments. For example, even in the case where there is a difference between the height position of the respective upper surfaces of the ECs 96 supplied from the EC supplying device 21 and that of the upper surface of the PCB 14 on which the ECs 96 are mounted, this difference can be made null by moving the Z-axis slide and thereby moving the shaft members 90, 242. The Z-axis slide may be moved concurrently with the movements of the X-axis and Y-axis slides 62, 48, and/or with the movement of each shaft member 90, 242 by the air cylinder 125, 252. Also in the case where the Z-axis slide is employed, each shaft member 90, 242 may be moved up and down by the air cylinder 125, 252, concurrently with the movements of the X-axis and Y-axis slides 62, 48. Otherwise, the difference between the the height position of the EC supplying device 21 and that of the PCB 14 can be made null by operating each air cylinder 125, 252 and thereby moving the corresponding shaft member 90, 242 up and down.

The principle of the present invention may be applied to the EC mounting device disclosed in U.S. patent application Ser. No. 08/979,828 assigned to the Assignee of the present application. The disclosed EC mounting device includes a plurality of holder-support shaft members and an intermittent-rotation body which is intermittently rotatable about an axis line and which supports the shaft members such that the shaft members are equiangularly spaced from each other about the axis line and each of the shaft members is movable in a direction parallel to the axis line. The shaft members holders are provided with respective cam followers each of which follows an annular cam surface of a stationary cam which is fixed to a member which supports the rotation body such that the body is rotatable about the axis line. The center of the annular cam surface is located on the axis line of the rotation body, and the cam surface extends in a direction perpendicular to the axis line. The annular cam surface includes a portion whose height position changes in a circumferential direction of the surface. When the rotation body is rotated and the cam follower of each of the shaft members follows that portion of the annular cam surface, the each shaft member is moved in a direction parallel to the axis line of the rotation body. In this case, the holder-support shaft members may be adapted such that the shaft members can be moved up and down not only by respective air cylinders but also by the stationary cam and the cam followers. Therefore, for example, a difference between the height position of an EC supplying device and that of a PCB can be made null since each of the shaft members is moved by the cooperation of the cam and the corresponding one of the cam followers. The EC mounting device additionally includes a rotating device which intermittently rotates the rotation body, and a moving device which moves the rotation body and the rotating device to an arbitrary position on an EC-transfer plane bridging a PCB supporting and conveying device and the EC supplying device. This moving device cooperates with the rotating device to provide a moving device which moves the rotation body in a direction intersecting respective axis lines of the holder-support shaft members.

It is to be understood that the present invention may be embodied with various changes, modifications, and improvements that may occur to those skilled in the art without departing from the scope and spirit of the invention defined in the appended claims.

What is claimed is:

1. An electric-component transferring apparatus, comprising:
   at least one component holder which holds an electric component;
   at least one shaft member whose lower end portion supports the component holder;
   a movable member having at least one support hole which supports the shaft member such that the shaft member is rotatable about an axis line relative to the movable member and is movable relative to the movable member in an axial direction parallel to the axis line;
   a moving device which moves the movable member in a direction intersecting the axis line of the shaft member;
   a piston which is supported by the shaft member such that the piston is not movable relative to the shaft member in the axial direction of the shaft member;

the support hole including a portion defining a cylinder bore which cooperates with the piston to provide an air-pressure-operated cylinder device which moves the shaft member in the axial direction thereof relative to the movable member;

a driven wheel which is substantially integral with the shaft member so that the driven wheel is rotatable with the shaft member about the axis line thereof relative to the movable member and is movable with the shaft member in the axial direction thereof relative to the movable member;

a drive wheel which is supported by the movable member such that the drive wheel is meshed with the driven wheel to rotate the driven wheel and thereby rotate the shaft member about the axis line thereof and such that when the shaft member is moved in the axial direction thereof relative to the movable member by the air-pressure-operated cylinder device the driven wheel is moved with the shaft member in the axial direction thereof relative to the drive wheel while the driven wheel is kept meshed with the drive wheel; and one of the drive wheel and the driven wheel having a length which assures that the drive and driven wheels are kept meshed with each other when the driven wheel is moved with the shaft member in the axial direction thereof relative to the drive wheel.

2. The apparatus according to claim 1, wherein the component holder comprises a suction nozzle which has a vacuum-supply hole opening at a lower end thereof, and which sucks and holds the electric component by applying vacuum thereto.

3. The apparatus according to claim 2, wherein the suction nozzle is supported by the lower end portion of the shaft member such that the nozzle is slideable relative to the shaft member in the axial direction thereof, and wherein the component holder further comprises a spring member which is provided between the shaft member and the suction nozzle and which biases the nozzle so that the nozzle projects downward from the lower end portion of the shaft member.

4. The apparatus according to claim 2, wherein the shaft member and the movable member have respective vacuum-supply passages which are kept communicated with each other while the shaft member is rotated, and is moved in the axial direction thereof, relative to the movable member, and the vacuum-supply hole of the suction nozzle is connected to the respective vacuum supply passages of the shaft member and the movable member.

5. The apparatus according to claim 1, wherein the piston is supported by an upper end portion of the shaft member.

6. The apparatus according to claim 1, wherein the piston is produced separately from the shaft member and then is attached to the shaft member.

7. The apparatus according to claim 1, wherein the piston is not rotatable relative to the shaft member.

8. The apparatus according to claim 1, wherein the piston is provided with no sealing member, and is substantially airtightly fitted in the cylinder bore such that substantially no clearance is left between an outer circumferential surface of the piston and an inner circumferential surface of the bore.

9. The apparatus according to claim 1, further comprising a stopper which is supported by the movable member such that the stopper is opposed to an upper end portion of the shaft member, and which defines an upper stroke end of a movement of the shaft member relative to the movable member, one of the stopper and the shaft member including a projection which is buttable against the other of the stopper and the shaft member at a point on the axis line of the shaft member.

10. The apparatus according to claim 1, further comprising a stopper which is supported by the movable member such that the stopper is opposed to an upper end portion of the shaft member, and which defines an upper stroke end of a movement of the shaft member relative to the movable member, the stopper including a displaceable member which is displaceable relative to the movable member in a direction parallel to the axis line of the shaft member, and a cushion member which is provided between the movable member and the displaceable member.

11. The apparatus according to claim 9, wherein the cushion member is formed of a vibration damping rubber which absorbs impact of the displaceable member and damps vibration of the displaceable member.

12. The apparatus according to claim 1, wherein the movable member comprises a main member having sleeve-support hole, and a hollow sleeve fitted in the sleeve-support hole, an inner hole of the hollow sleeve defining at least a portion of the support hole of the movable member.

13. The apparatus according to claim 12, wherein the sleeve is fitted in a lower portion of the sleeve-support hole of the main member, the cylinder bore including an upper portion of the sleeve-support hole.

14. The apparatus according to claim 13, wherein the sleeve-support hole of the main member comprises a through-hole which is formed through the main member, and wherein the apparatus further comprising a closing member which closes an upper opening of the through-hole, the cylinder bore including an upper portion of the through-hole that is defined by, and between, the closing member and an upper end surface of the hollow sleeve.

15. The apparatus according to claim 1, further comprising at least one detectable portion which is substantially integral with the shaft member, and a detector which is supported by the movable member and which detects the detectable portion, the detectable portion and the detector cooperating with each other to provide a stroke-end detector which detects at least one of an upper stroke end and a lower stroke end of the movement of a shaft member relative to the movable member.

16. The apparatus according to claim 1, wherein the movable member has at least one pressurized-air supply-and-relief passage which is communicated with the air-pressure-operated cylinder device.

17. The apparatus according to claim 1, comprising:
a plurality of said shaft members, the movable member having a plurality of said support holes which support said plurality of shaft members, respectively, on a circle whose center is positioned on an axis line of the drive wheel about which the drive wheel is rotatable; and
a plurality of said driven wheels each of which is substantially integral with a corresponding one of said plurality of shaft members, the drive wheel being meshed with said plurality of said driven wheels to simultaneously rotate the driven wheels.

18. An electric-component mounting system, comprising:
an electric-component mounting apparatus comprising an electric-component transferring apparatus comprising:
at least one component holder which holds an electric component;
at least one shaft member whose lower end portion supports the component holder;
a movable member having at least one support hole which supports the shaft member such that the shaft member is rotatable about an axis line relative to the movable member and is movable relative to the movable member in an axial direction parallel to the axis line;

a moving device which moves the movable member in a direction intersecting the axis line of the shaft member;

a piston which is supported by the shaft member such that the piston is not movable relative to the shaft member in the axial direction of the shaft member;

the support hole including a portion defining a cylinder bore which cooperates with the piston to provide an air-pressure-operated cylinder device which moves the shaft member in the axial direction thereof relative to the movable member;

a driven wheel which is substantially integral with the shaft member, so that the driven wheel is rotatable with the shaft member about the axis line thereof relative to the movable member and is movable with the shaft member in the axial direction thereof relative to the movable member;

a drive wheel which is supported by the movable member such that the drive wheel is meshed with the driven wheel to rotate the driven wheel and thereby rotate the shaft member about the axis line thereof, and such that when the shaft member is moved in the axial direction thereof relative to the movable member by the air-pressure-operated cylinder device, the driven wheel is moved with the shaft member in the axial direction thereof relative to the drive wheel while the driven wheel is kept meshed with the drive wheel;

one of the drive wheel and the driven wheel having a length which assures that the drive and driven wheels are kept meshed with each other when the driven wheel is moved with the shaft member in the axial direction thereof relative to the drive wheel;

an electric-component supplying device which supplies electric components to the electric-component mounting apparatus; and a board supporting device which supports a printed circuit board on which the electric components are mounted by the electric-component mounting apparatus.

19. The system according to claim 18, wherein the moving device of the electric-component transferring apparatus moves the movable member in each of a first direction parallel to an X axis and a second direction parallel to a Y axis, the X and Y axes being perpendicular to each other on a substantially horizontal plane.

20. The system according to claim 19, wherein the board supporting device comprises a printed-circuit-board conveying device which conveys the printed circuit board along a straight reference line and stops the board at a position corresponding to the electric-component transferring apparatus.

21. The system according to claim 20, wherein the electric-component mounting apparatus comprises a plurality of component mounting units which are arranged along a straight line parallel to the reference line and each of which has a component-mount region in which said plurality component mounting units is allowed to mount electric components on the printed circuit board, and wherein the printed-circuit-board conveying device conveys, along the reference line, the printed circuit board at a predetermined convey pitch which is not longer than a length of the component-mount region of said each of the component mounting units.

22. The system according to claim 21, wherein the electric-component supplying device comprises a plurality of unit groups each of which comprises a plurality of component supplying units, each of said plurality of component supplying units storing electric components of a corresponding one of a plurality of sorts, and including a component-supply portion from which said each of said plurality of component supplying units supplies the electric components one by one, said plurality of component supplying units of said each of said plurality of unit groups being arranged along a straight line parallel to the reference line, said plurality of component mounting units corresponding to said plurality of unit groups, respectively.

23. The system according to claim 18, wherein the electric-component transferring apparatus comprises:

at least one pair of said component holders, each
of said component holders of said one pair of said component holders sucking and holding one of said electric components supplied from the electric-components supplying device, by applying vacuum to said one of said electric components, the movable member supporting said one pair of component holders;

an image taking device which has a square range of view and which takes respective images of the electric components held by said one pair of said component holders;

an error detecting and correcting device which is connected to the image taking device and which detects and corrects, based on the taken image of each of the electric components held by said one pair of said component holders, at least one of (a) a positional error of said each of said electric components from a reference position in at least one direction parallel to a plane on which the printed circuit board is supported by the board supporting device and (b) an angular error of said each of said electric components from a reference angular position about an axis line perpendicular to the plane, so that the electric components are mounted on the printed circuit board after said at least one of said positional error and said angular error of said each of said electric components is corrected;

the moving device moving the movable member from a component-receive position where each of the component holders of said one pair of said component holders is opposed to the electric-component supplying device, to a component-mount position where said each component holders mounts said each of the electric components on the printed circuit board supported by the board supporting device, via an image-take position where the movable member is stopped by the moving device such that respective axis lines of the component holders of said one pair perpendicularly intersect one of two diagonal lines of the square range of view of the image taking device, at respective positions which are axis-symmetric with each other with respect to an optical axis of the image taking device, so that the image taking device simultaneously takes the respective images of the electric components held by said one pair of said component holders.

* * * * *